United States Patent
Kim et al.

(10) Patent No.: US 9,478,300 B2
(45) Date of Patent: Oct. 25, 2016

(54) OPERATION METHOD OF NONVOLATILE MEMORY SYSTEM

(71) Applicants: Kwanghoon Kim, Uiwang-si (KR); Younggeon Yoo, Seoul (KR); Junjin Kong, Yongin-si (KR)

(72) Inventors: Kwanghoon Kim, Uiwang-si (KR); Younggeon Yoo, Seoul (KR); Junjin Kong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/883,922

(22) Filed: Oct. 15, 2015

(65) Prior Publication Data

US 2016/0148703 A1 May 26, 2016

(30) Foreign Application Priority Data

Nov. 24, 2014 (KR) .................. 10-2014-0164546

(51) Int. Cl.
G11C 11/34 (2006.01)
G11C 16/26 (2006.01)
G11C 16/04 (2006.01)

(52) U.S. Cl.
CPC .......... *G11C 16/26* (2013.01); *G11C 16/0483* (2013.01)

(58) Field of Classification Search
CPC .................. G11C 16/26; G11C 16/0483
USPC .......... 365/185.17, 185.18, 185.2, 185.21, 365/185.22, 185.23, 185.24
See application file for complete search history.

(56) References Cited

U.S. PATENT DOCUMENTS

| | | | |
|---|---|---|---|
| 7,480,184 B2 | 1/2009 | Lam | |
| 7,679,133 B2 | 3/2010 | Son et al. | |
| 7,936,601 B2 | 5/2011 | Kang et al. | |
| 8,355,285 B2 | 1/2013 | Huang et al. | |
| 8,422,291 B2 | 4/2013 | Kim et al. | |
| 8,516,183 B2 | 8/2013 | Eun et al. | |
| 8,547,740 B2 | 10/2013 | Sommer et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,773,922 B2 | 7/2014 | Song et al. | |
| 8,804,421 B2 | 8/2014 | Motwani | |
| 2008/0165595 A1 | 7/2008 | Lam | |
| 2009/0003057 A1 | 1/2009 | Kang et al. | |
| 2009/0121271 A1 | 5/2009 | Son et al. | |
| 2010/0118608 A1 | 5/2010 | Song et al. | |
| 2010/0302850 A1 | 12/2010 | Kim et al. | |
| 2011/0038209 A1 | 2/2011 | Huang et al. | |
| 2011/0216603 A1 | 9/2011 | Han et al. | |
| 2011/0233648 A1 | 9/2011 | Seol et al. | |
| 2011/0289278 A1 | 11/2011 | Eun et al. | |

(Continued)

FOREIGN PATENT DOCUMENTS

KR    20140052691 A    5/2014

*Primary Examiner* — Fernando Hidalgo
(74) *Attorney, Agent, or Firm* — Harness, Dickey & Pierce, P.L.C.

(57) ABSTRACT

An operation method of a nonvolatile memory system in accordance with example embodiments of inventive concepts includes detecting an on-cell count of the memory cells using a sampling start voltage, comparing the detected on-cell count with a reference value, setting a plurality of sampling voltages based on the comparison result, performing a sampling operation with respect to the memory cells using the sampling voltages, and detecting an optimum read voltage for distinguishing any one program state among the program states based on a result of the sampling operation.

20 Claims, 25 Drawing Sheets

(56) References Cited

U.S. PATENT DOCUMENTS

| | | |
|---|---|---|
| 2012/0051143 A1 | 3/2012 | Yoon et al. |
| 2013/0121080 A1 | 5/2013 | Sommer et al. |
| 2013/0279262 A1 | 10/2013 | Yoon et al. |
| 2014/0016410 A1 | 1/2014 | Choi et al. |
| 2014/0119114 A1 | 5/2014 | Motwani |
| 2014/0119124 A1 | 5/2014 | Kim et al. |
| 2014/0198569 A1 | 7/2014 | Kim et al. |
| 2016/0148695 A1* | 5/2016 | Kim ............ G11C 16/12 365/185.03 |

* cited by examiner

FIG. 10
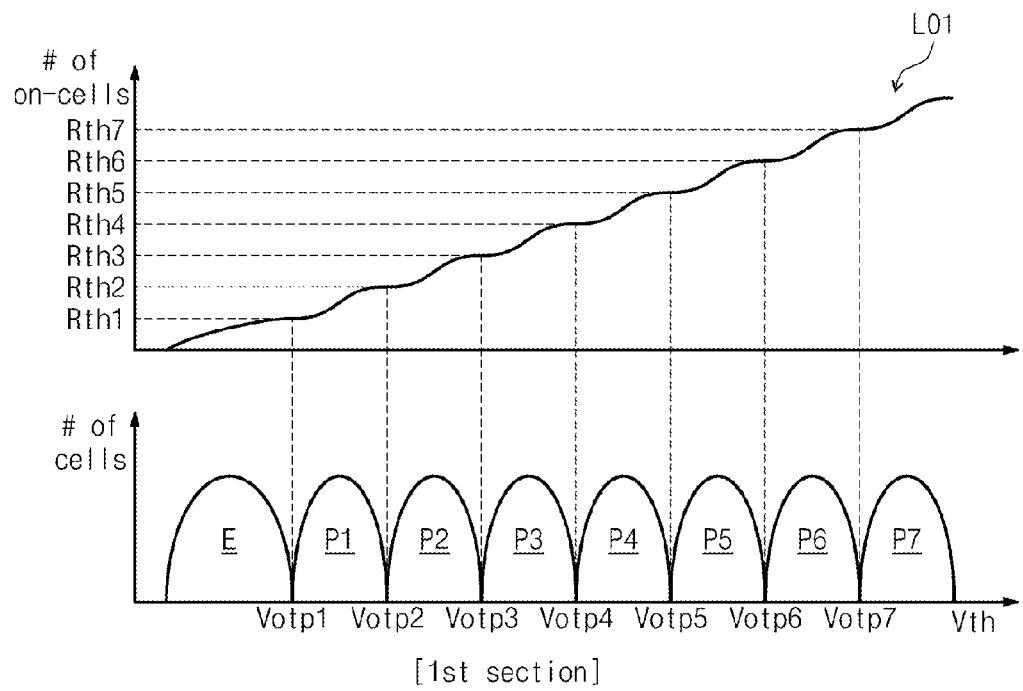
[1st section]
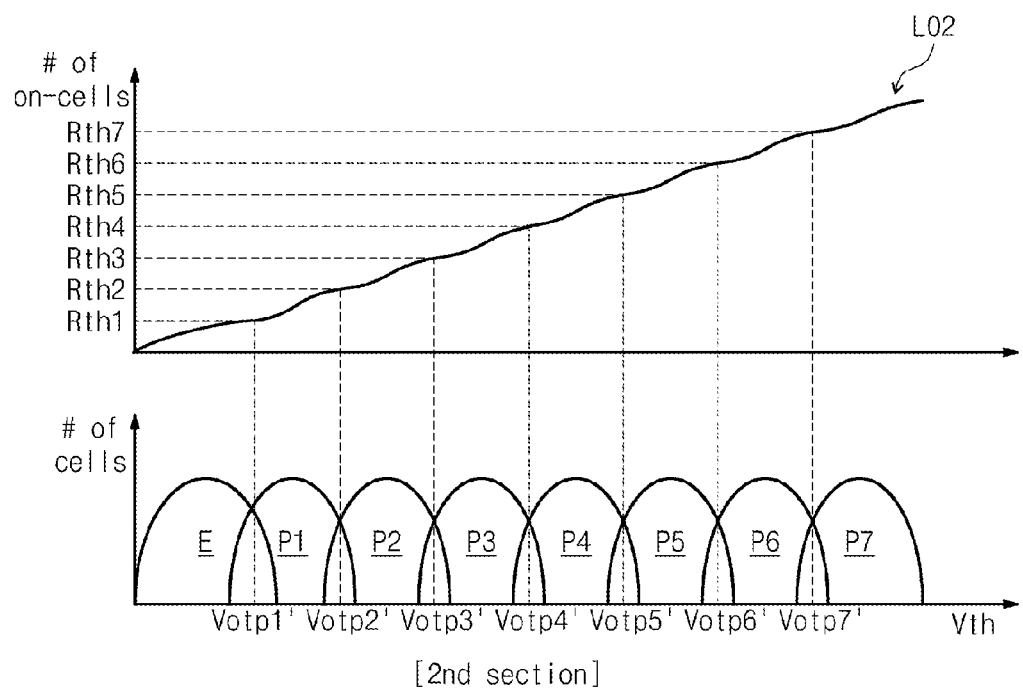
[2nd section]

OPERATION METHOD OF NONVOLATILE MEMORY SYSTEM

CROSS-REFERENCE TO RELATED APPLICATIONS

The present application claims priority under 35 U.S.C. §119 to Korean Patent Application No. 10-2014-0164546 filed on Nov. 24, 2014, in the Korean Intellectual Property Office, the entire contents of which are hereby incorporated by reference.

TECHNICAL FIELD

Inventive concepts relates to a semiconductor memory, and more particularly, to an operation method of a nonvolatile memory device.

BACKGROUND

A semiconductor memory device is a memory device that may be formed using a semiconductor such as silicon Si, germanium Ge, gallium arsenide GaAs, indium phosphide InP, etc. A semiconductor memory device may be classified as a volatile semiconductor memory device or a nonvolatile semiconductor memory device.

A volatile memory device loses its stored data when its power supply is interrupted. Examples of volatile memory devices include a static RAM (SRAM), a dynamic RAM (DRAM), a synchronous DRAM (SDRAM), etc. A nonvolatile memory device retains its stored data even when its power supply is interrupted. Examples of nonvolatile memory devices include a read only memory (ROM), a programmable ROM (PROM), an electrically programmable ROM (EPROM), an electrically erasable and programmable ROM (EEPROM), a flash memory, a phase change RAM (PRAM), a magnetic RAM (MRAM), a resistive RAM (RRAM), a ferroelectric RAM (FRAM), etc.

Flash memory is being used in various fields because of features such as low noise, a high capacity, etc. A flash memory stores data by changing threshold voltages of memory cells. A flash memory device senses threshold voltages of memory cells and decodes stored data using desired (and/or alternatively predetermined) read voltages. However, due to various factors, errors may be included in data stored in a flash memory device. Various technologies for restoring those errors are being developed these days.

SUMMARY

Example embodiments of inventive concepts relate to an operation method of a nonvolatile memory system including a memory controller configured to control a nonvolatile memory. The nonvolatile memory device comprises a three-dimensional memory cell array including a plurality of memory blocks each comprising a plurality of cell strings, each of cell strings comprises the plurality of memory cells stacked in a direction perpendicular to a substrate, a ground selection transistor disposed between the memory cells and the substrate, and a string selection transistor disposed between the memory cells and a bitline. The operation method comprises performing a cell-counting operation on selected memory cells of the plurality of memory cells to detect a cell count; comparing the detected cell count with a reference value; setting a plurality of sampling voltages based on a result of the comparison; performing a sampling operation with respect to the selected memory cells using the plurality of sampling voltages; and performing a read operation on the selected memory cells based on a result of the sampling operation.

In example embodiments, the cell-counting operation includes reading data from the selected memory cells; detecting and correcting an error of the read data; and detecting the cell count of the selected memory cells using a sampling start voltage of the plurality of sampling voltages if the error of the read data is not corrected.

In example embodiments, the setting a plurality of sampling voltages based on a result of the comparison includes setting the plurality of sampling voltages lower than the sampling start voltage if the detected cell count is greater than the reference value, or setting the plurality of sampling voltages higher than the sampling start voltage if the detected cell count is not greater than the reference value.

In example embodiments, the performing a sampling operation includes generating a plurality of sample data by performing the sampling operation on the selected memory cells using the plurality of sampling voltage; and detecting first through third values using the generated sample data.

In example embodiments, the performing the sampling operation further includes comparing the first through third values; and performing an additional sampling operation on the selected memory cells or the detecting an optimum read voltage.

In example embodiments, the sampling voltages include the sampling start voltage and first through third sampling voltages. The detecting the first through third values includes detecting the first value using the lowest two sampling voltages among the sampling start voltage and the first through third sampling voltages and detecting the third value using the highest two sampling voltages among the sampling start voltage and the first through third sampling voltages, and the performing the additional sampling operation on the memory cells or the detecting the optimum read voltage includes the detecting the optimum read voltage if the second value is smaller than the first and third values, and the performing the additional sampling operation if the second value is not smaller than the first and third values.

In example embodiments, the detecting optimum read voltage is performed using a regression analysis.

In example embodiments, the performing a read operation on the selected memory cells comprises reading data stored in the selected memory cells using the optimum read voltage.

In example embodiments, the reference value has a different value depending on each of program states of the selected memory cells.

In example embodiments, the reference value corresponds to a number of memory cells turned-on by an optimum read voltage with respect to each of the program states.

In example embodiments, the data stored in the selected memory cells is randomized data.

Example embodiments of inventive concepts relate to an operation method of a storage device. The storage device includes a three-dimensional memory cell array including a plurality of memory blocks each comprising a plurality of cell strings, each of cell strings comprises the plurality of memory cells stacked in a direction perpendicular to a substrate, a ground selection transistor disposed between the memory cells and the substrate, and a string selection transistor disposed between the memory cells and a bitline. The operation method comprises detecting first through third values by sampling selected memory cells of the plurality of memory cells using first through fourth sampling voltages; comparing the first through third values; comparing a cell count corresponding to any one sampling voltage among the first through fourth sampling voltages with a reference value, based on a result of the comparing the first through third values; performing an additional sampling operation on the selected memory cells based on a result of the comparing the cell count and the reference value; and performing read operation on the memory cells based on a result of the additional sampling operation.

In example embodiments, the first sampling voltage is smaller than the second sampling voltage, the first sampling voltage is smaller than the second sampling voltage, the second sampling voltage is smaller than the third sampling voltage, the third sampling voltage is smaller than the fourth sampling voltage, and the detecting first through third values includes determining the first value based on a number of memory cells having a threshold voltage between the first and second sampling voltages, determining the second value based on a number of memory cells having a threshold voltage between the second and third sampling voltages, determining the third value based on a number of memory cells having a threshold voltage between the third and fourth sampling voltages, among the selected memory cells.

In example embodiments, the comparing the first through third values includes determining whether the second value is smaller than the first and third values.

In example embodiments, the comparing the cell count with the reference value includes comparing the cell count with the reference value if the second value is not smaller than the first and third values.

Example embodiments of inventive concepts relate to an operation method of a nonvolatile memory device. The nonvolatile memory device comprises a three-dimensional memory cell array including a plurality of memory blocks each comprising a plurality of cell strings, each of cell strings comprises the plurality of memory cells stacked in a direction perpendicular to a substrate, a ground selection transistor disposed between the memory cells and the substrate, and a string selection transistor disposed between the memory cells and a bitline. The operation method comprises performing a cell counting operation on selected memory cells of the plurality of memory cells to detect a cell count; comparing the detected cell count with a reference value; performing a sampling operation on the selected memory cells based on a result of comparison; the sampling operation including setting first to third sampling voltages in one of a first direction and a second direction relative to a previous sampling voltage applied to the selected memory cells based on a result of the comparison, the first direction being different than the second direction, the first to third sampling voltages being different from each other; and performing a read operation on the selected memory cells based on a result of the sampling operation.

In example embodiments, the performing a cell counting operation includes reading data from the selected memory cells by applying a sampling start voltage to a selected word line connected to the selected memory cells, detecting the cell count based on the read data.

In example embodiments, the performing the sampling operation in the first direction including setting the first to third sampling voltages lower than the previous sampling voltage, and the performing the sampling operation in the second direction including setting the first to third sampling voltages higher than the previous sampling voltage.

In example embodiments, the performing the sampling operation includes detecting first through third values from selected the memory cells using the first through third sampling voltages, the second sampling voltage is in between the first and third sampling voltages, the performing the sampling operation includes determining the first value based on a number of the memory cells in the same page having a threshold voltage between the previous sampling voltage and the first sampling voltage, determining the second value based on a number of the memory cells in the same page having a threshold voltage between the first sampling voltage and the second sampling voltage, and determining the third value based on a number of the memory cells in the same pages having a threshold voltage between the second sampling voltage and the third sampling voltage.

In example embodiments, the operation method further comprises comparing the first to third values; and performing an additional sampling operation if the second value is greater than the first value or the second value is greater than the third value, and reading data from the memory cells in the same page using the optimum read voltage if the second value is less than the first value and the second value is less than the third value.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 10 are graphs illustrating a threshold voltage distribution of a plurality of memory cells connected to one word line and the number of corresponding on-cells.

DETAILED DESCRIPTION OF EXAMPLE EMBODIMENTS

Figure 1:
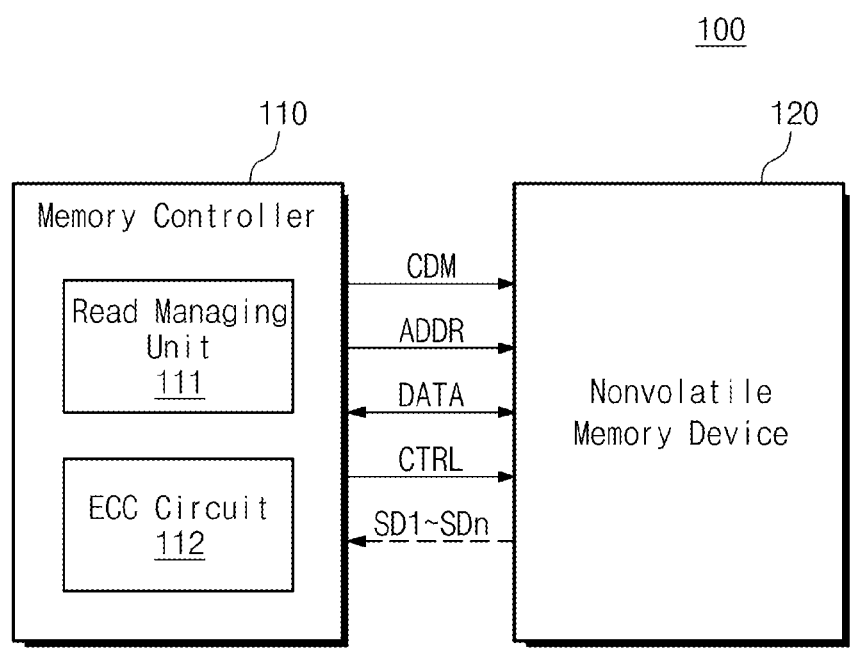
FIG. 1 is a block diagram illustrating a nonvolatile memory system in accordance with example embodiments of inventive concepts.

Detailed example embodiments of inventive concepts are disclosed herein. However, specific structural and functional details disclosed herein are merely representative for purposes of describing example embodiments of inventive concepts. Example embodiments of inventive concepts may, however, be embodied in many alternate forms and should not be construed as limited to only the embodiments set forth herein.

Accordingly, while example embodiments of inventive concepts are capable of various modifications and alternative forms, embodiments thereof are shown by way of example in the drawings and will herein be described in detail. It should be understood, however, that there is no intent to limit example embodiments of inventive concepts to the particular forms disclosed, but to the contrary, example embodiments of inventive concepts are to cover all modifications, equivalents, and alternatives falling within the scope of example embodiments of inventive concepts. Like numbers refer to like elements throughout the description of the figures. In the drawings, the thicknesses of layers and regions are exaggerated for clarity. Like reference characters and/or numerals in the drawings denote like elements, and thus their description may be omitted.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

According to inventive concepts, when detecting an optimum read voltage for distinguishing a certain program state, a nonvolatile memory system can set a sampling direction by comparing on-cells count with a reference value. Because of this, reliability of an optimum read voltage detection is improved even in a rapid threshold voltage change state of memory cells. Thus, a nonvolatile memory system having improved reliability is provided.

FIG. 1 is a block diagram illustrating a nonvolatile memory system in accordance with example embodiments of inventive concepts. Referring to FIG. 1, a nonvolatile memory system 100 includes a memory controller 110 and a nonvolatile memory device 120. The memory controller 110 can write data in the nonvolatile memory device 120 or can read data stored in the nonvolatile memory device 120 in response to a request of an external device (for example, a host, an application processor, etc.). For example, the memory controller 110 can transmit an address ADDR, a command CMD, and a control signal CTRL to the nonvolatile memory device 120. The memory controller 110 can exchange data DATA with the nonvolatile memory device 120.

The nonvolatile memory device 120 can write data or transmit stored data to the memory controller 110 under the control of the memory controller 110. The nonvolatile memory device 120 may include a plurality of memory blocks and each memory block may include a plurality of pages. Each page may include a plurality of memory cells. Each memory cell may be a SLC (single level cell) storing 1 bit or a MLC (multi level cell) storing at least 2 bits.

The memory controller 110 may include a read management unit 111 and an ECC (error correction code) circuit 112. The read management unit 111 can manage or control a series of operations for reading data stored in the nonvolatile memory device 120.

The ECC circuit 112 can detect and correct an error of data DATA received from the nonvolatile memory device 120. For example, when data is written in the nonvolatile memory device 120, the ECC circuit 112 can generate an error correction code with respect to data to be written. The generated error correction code may be written in the nonvolatile memory device together with the data DATA. After that, when the written data DATA is read, the ECC circuit 112 can detect and correct an error of the read data DATA on the basis of the error correction code written in the nonvolatile memory device 120. The ECC circuit 112 has desired (and/or alternatively predetermined) error correction ability. An error exceeding an error correction ability of the ECC circuit 112 is called an UECC (uncorrectable error correction code) error and data including an UECC error is called UECC data.

In the case that data including an error not corrected by the ECC circuit 112, that is, UECC data is read, the read management unit 111 receives a plurality of sample data SD1~SDn from the nonvolatile memory device 120 and can control a plurality of read voltages on the basis of the received sample data SD1~SDn. The sample data SD1~SDn may be data read (or sampled) from a selected page by different read voltages (or sampling voltages). The selected page indicates a page in which data is stored.

The read management unit 111 can set a sampling direction based on any one of the sample data SD1~SDn. The sampling direction indicates a direction in which the sampling voltages increase or a direction in which the sampling voltages decrease. That is, the read management unit 111, based on any one of the sample data SD1~SDn, may sample a page in which data is stored in a direction in which a threshold voltage of memory cells increases or may sample a page in which data is stored in a direction in which a threshold voltage of memory cells decreases. The read management unit 111 can detect an optimum read voltage on the basis of the sampled data (e.g., SD1~SDn). A sampling method and an optimum read voltage detection method of the read management unit 111 will be described in further detail with reference to drawings below.

Figure 2:
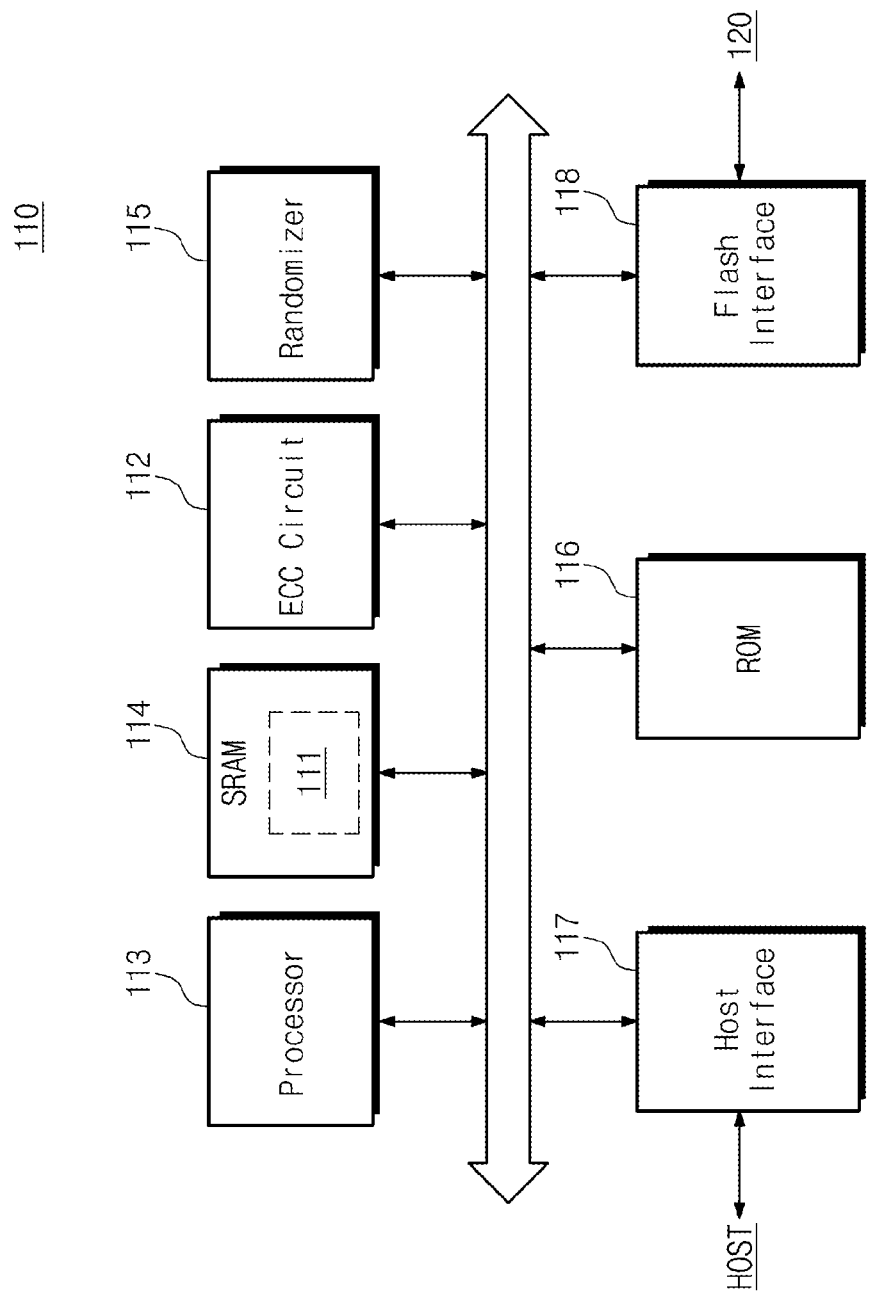
FIG. 2 is a block diagram illustrating a memory controller of FIG. 1 in further detail.

FIG. 2 is a block diagram illustrating a memory controller of FIG. 1 in further detail. Referring to FIGS. 1 and 2, the memory controller 110 includes a processor 113, a SRAM 114, an ECC (error correction code) circuit 112, a randomizer 115, a ROM 116, a host interface 117 and a flash interface 118. Since the ECC circuit 112 was described with reference to FIG. 1, a detailed description thereof is omitted.

The processor 113 can control an overall operation of the memory controller 110. The SRAM 114 may be used as a buffer memory, a cache memory or an operation memory of the memory controller 110. The read management unit 111 described with reference to FIG. 1 may be provided in a software form and may be stored in the SRAM 114. The read management unit 111 stored in the SRAM 114 may be driven by the processor 113. The read management unit 111 may be stored in the nonvolatile memory 120 and be loaded from the nonvolatile memory device 120 to the SRAM 114 at power-on.

The randomizer 115 can randomize data stored in the nonvolatile memory device 120. For example, the randomizer 115 can randomize data to be stored in the nonvolatile memory device 120 by a word line unit or a page unit.

A data randomization indicates processing data so that memory cells connected to one word line have a program state of the same ratio. For example, in the case that each of memory cells connected to one word line is a MLC (multi level cell) storing 2 bits data, each memory cell may have any one of an erase state and first through third program states. At this time, the randomizer 115 can randomize data so that among memory cells connected to one word line, the number of memory cells having the erase state, the number of memory cells having the first program state, the number of memory cells having the second program state and the number of memory cells having the third program state are the substantially same with one another. That is, memory cells in which randomized data is stored may have the substantially same number of program states. The randomizer 115 can randomize can derandomize data read from the nonvolatile memory device 120. The derandomizing operation indicates an operation of restoring randomized data to its original data.

The ROM 116 can store information required when the memory controller 110 operates in a firmware form.

The memory controller 110 can communicate with an external device (for example, a host, AP, etc.) through the host interface 117. The host interface 117 may include various interfaces such as a universal serial bus (USB), a multimedia card (MMC), an embedded-MMC, a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), a mobile industry processor interface (MIPI), a nonvolatile memory-express (NVM-e), a universal flash storage (UFS), etc. The memory controller 110 can communicate with the nonvolatile memory device 120 through the flash interface 117. The flash interface 117 may include a NAND interface.

Figure 3:
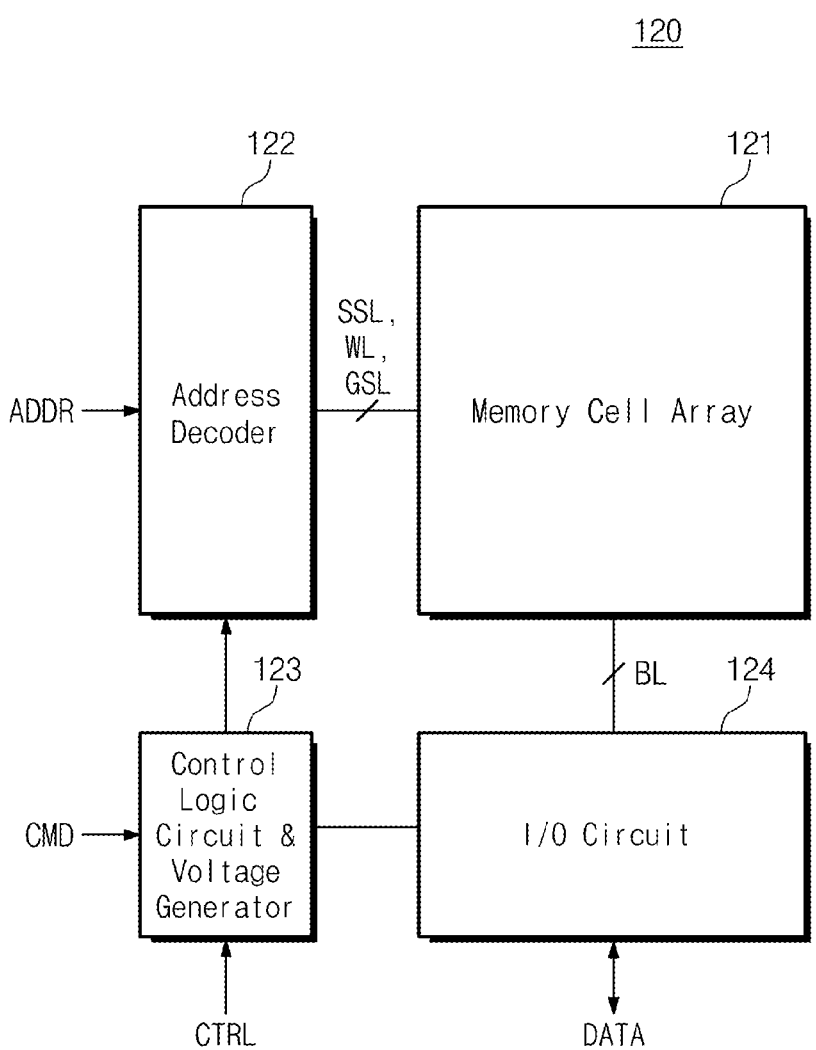
FIG. 3 is a block diagram illustrating a nonvolatile memory device of FIG. 1 in further detail.

FIG. 3 is a block diagram illustrating a nonvolatile memory device of FIG. 1 in further detail. Referring to FIGS. 1 and 3, the nonvolatile memory device 120 may include a memory cell array 121, an address decoder 122, a control logic circuit & voltage generator 123 and an input/output circuit 124.

The memory cell array 121 may include a plurality of memory blocks. Each memory block may include a plurality of memory cells. The plurality of memory cells may be connected to a plurality of word lines WL respectively. Each memory block may be a SLC (single level cell) storing 1 bit or may be a MLC (multi level cell) storing at least 2 bits. In example embodiments, memory cells connected to one word line may be comprised in one page (e.g., physical page) or memory cells connected to one word line may comprises at least one page (e.g., logical page). For brevity of description, unless the context clearly indicates otherwise, it will be assumed that the term "page" used herein indicates a physical page including memory cells connected to one word line. However, inventive concepts are not limited thereto.

The address decoder 122 may be connected to the memory cell array 121 through string select lines SSL, a plurality of word lines WLs and ground select lines GSL. The address decoder 122 can receive an address ADDR from the memory controller 110 and decode the received address ADDR. The address decoder 122 can select at least one word line among the plurality of word lines on the basis of the decoded address ADDR, and control voltages of the selected word line.

The control logic circuit & voltage generator 123 can receive a command CMD and a control signal CTRL from the memory controller 110. In response to the received signals, the control logic circuit & voltage generator 123 can control the address decoder 122 and the input/output circuit 124 so that data DATA is written into the memory cell array 121 and/or so that data DATA stored in the memory cell array 121 may be read.

The control logic circuit & voltage generator 123 can generate various voltages used for operating the nonvolatile memory device 120. For example, the control logic circuit & voltage generator 123 can generate various voltages such as a plurality of select read voltages, a plurality of unselect read voltages, a plurality of program voltages, a plurality of pass voltages, a plurality of erase voltages, a plurality of sampling voltages, etc. The control logic circuit & voltage generator 123 can control the select read voltages and the sampling voltages. The sampling voltages indicates voltages being applied to a selected word line when the nonvolatile memory device 120 performs a read operation to generate sample data SD1~SDn.

The input/output circuit 124 is connected to the memory cell array 121 through a plurality of bit lines BL. The input/output circuit 124 receives data DATA from the memory controller 110 and can control voltages of the bit lines BL so that the received data DATA is written in the memory cell array 121. The input/output circuit 124 can control the bit lines BL to read data DATA stored in the memory cell array 121 according to a control of the control logic circuit & voltage generator 123.

The input/output circuit 124 may include constituent elements such as a page buffer (or a page register), a column select circuit, a data buffer, a global buffer, etc. The input/output circuit 124 may include constituent elements such as a sense amplifier, a write driver, a column select circuit, a data buffer, etc.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

In example embodiments, the nonvolatile memory device 120 may be comprises a three dimensional (3D) memory array. The 3D memory array may be monolithically formed one a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

Figure 4:
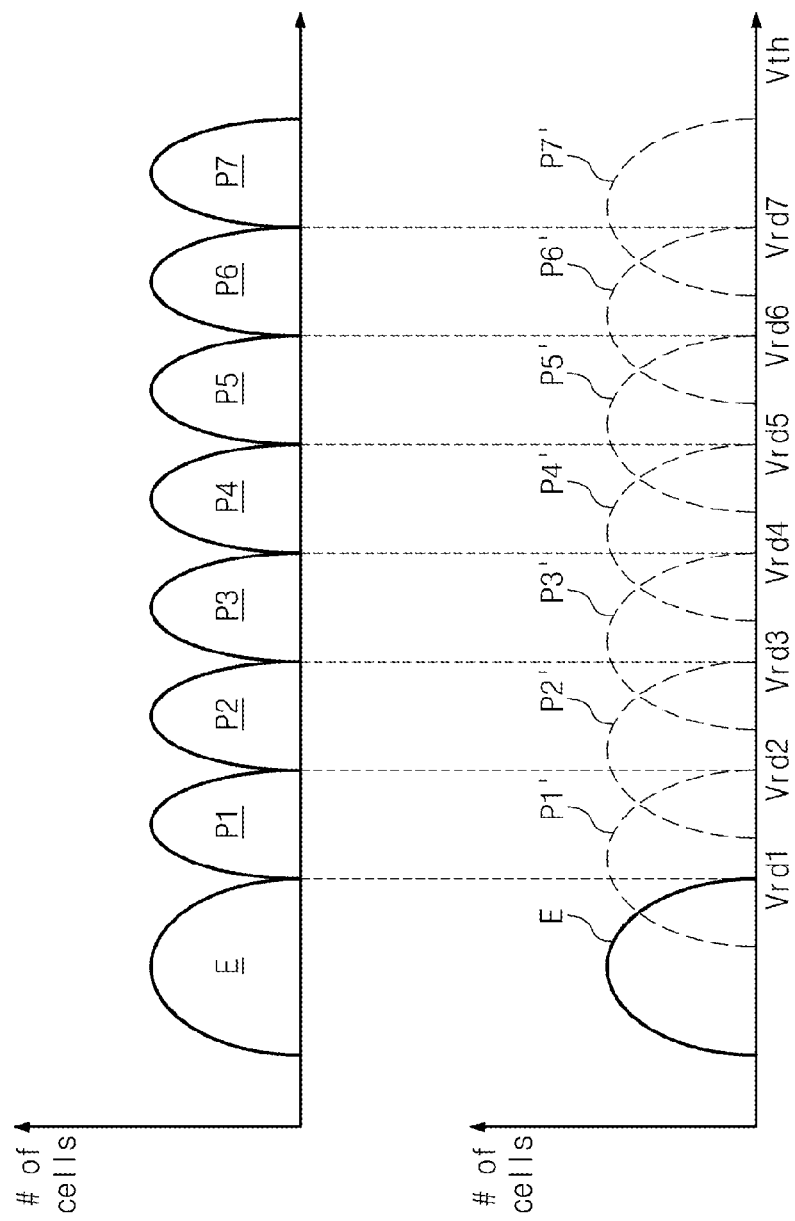
FIG. 4 is a distribution diagram illustrating a threshold voltage distribution of a plurality of memory cells included in a nonvolatile memory device of FIG. 1.

FIG. 4 is a distribution diagram illustrating a threshold voltage distribution of a plurality of memory cells included in a nonvolatile memory device of FIG. 1. Referring to FIGS. 1 and 4, as illustrated in a first section of FIG. 4, parts (that is, memory cells connected to one word line or memory cells included in one page) of the memory cells in the nonvolatile memory device 120 may be programmed to have an erase state E and first through seventh program states P1~P7. The nonvolatile memory device 120 can read data stored in the memory cells by detecting a program state of the memory cells (that is, threshold voltages of the memory cells).

The nonvolatile memory device 120 can distinguish a program state of memory cells on the basis of first through seventh select read voltages Vrd1~Vrd7 under the control of the memory controller 110. According to the distinguished result, the nonvolatile memory device 120 can transmit data DATA to the memory controller 110.

A threshold voltage distribution of memory cells may be changed due to various external factors (e.g., a program elapsed time, a temperature, interference of adjacent memory cells, PVT (process, voltage, and temperature) variations, etc.). That is, a threshold voltage distribution of the program states P1~P7 may be widened like program states P1'~P7'.

In this case, data which the nonvolatile memory device 120 reads based on the first through seventh select read voltages Vrd1~Vrd7 may include UECC errors. That is, as a threshold voltage distribution of the memory cells is changed, the nonvolatile memory device 120 may not accurately distinguish a program state of the memory cells.

In this case, the memory controller 110 may perform an operation of detecting optimum read voltages for distinguishing a program state of the memory cells of which a threshold voltage distribution is changed. The operation of detecting optimum read voltages will be described in further detail below.

Figure 5:
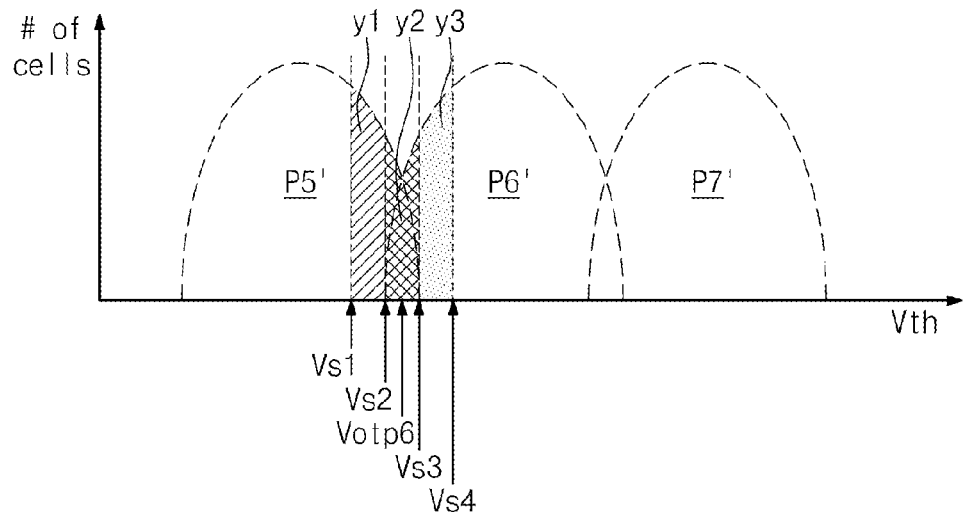
FIGS. 5 and 6 are drawings for explaining an optimum read voltage detection method of a memory controller.
Figure 6:
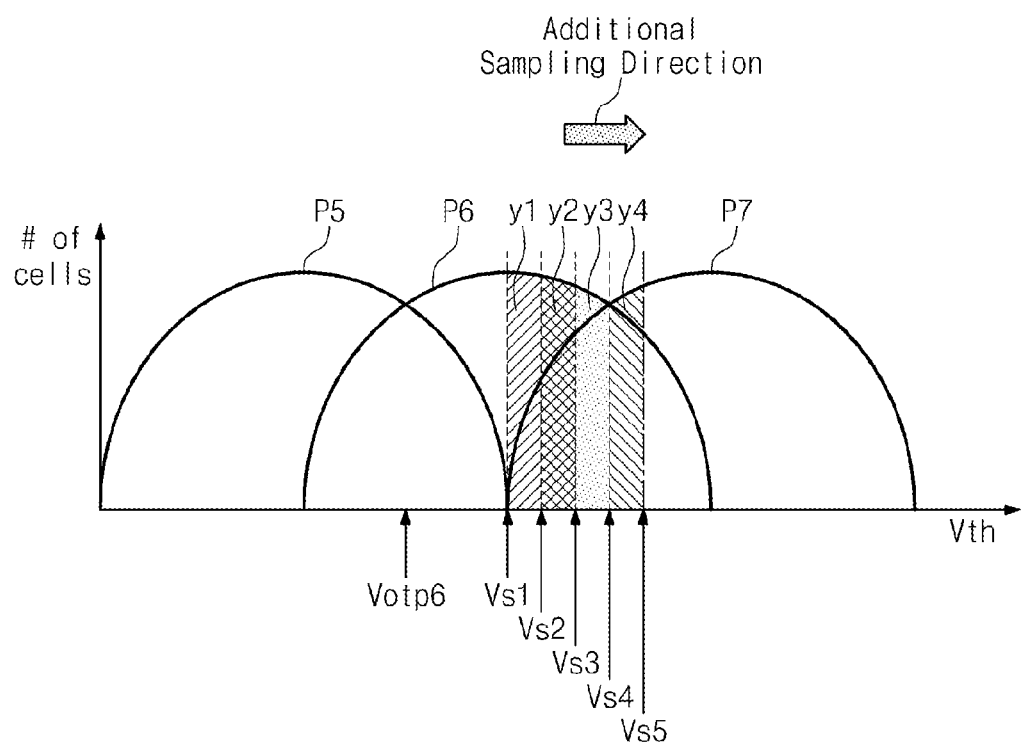

FIGS. 5 and 6 are drawings for explaining an optimum read voltage detection method of a memory controller. For brevity of description, an operation of detecting a sixth optimum read voltage Votp6 for detecting a sixth program state of a first page is described and constituent elements which do not need to describe the detection operation are omitted. However, inventive concepts are not limited thereto and a method that will be described below may be used to detect optimum read voltages for detecting different program states.

Referring to FIGS. 1 and 5, the memory controller 110 can read memory cells of a first page using each of first through fourth sampling voltages Vs1~Vs4. The memory controller 110 can detect first through third values y1, y2 and y3 on the basis of data (e.g., sample data) read by each of the first through fourth sampling voltages Vs1~Vs4. The first through third values y1, y2 and y3 indicate the number of memory cells having a threshold voltage included between the first through fourth sampling voltages Vs1~Vs4. In example embodiments, the memory cells of the first page may be selected memory cells connected to a selected wordline.

For example, the first value y1 indicates the number of memory cells having a threshold voltage between the first and second sampling voltages Vs1 and Vs2. The memory controller 110 can perform an exclusive OR operation on sample data SD1 read by the first sampling voltage Vs1 and sample data SD2 read by the second sampling voltage Vs2 to detect the first value y1. Similarly, the second and third values y2 and y3 indicate the number of memory cells having a threshold voltage between the second and third sampling voltages Vs2 and Vs3 and the number of memory cells having a threshold voltage between the third and fourth sampling voltages Vs3 and Vs4 respectively. The memory controller 110 can perform an exclusive OR operation on sample data SD2, SD3 and SD4 read by the two and third sampling voltage Vs2 and Vs3 to detect the second values y2 and y3.

The memory controller 110 can compare amount relation between the detected first through third values y1, y2 and y3. In the case that the second value y2 is smaller than the first value y1 and is smaller than the third value y3, the memory controller 110 can detect the sixth optimum read voltage Votp6 on the basis of the detected first through third values y1, y2 and y3.

For example, the memory controller 110 can model a distribution diagram of fifth and sixth program states P5' and P6' by a quadratic function on the basis of the first through third values y1, y2 and y3. The memory controller 110 can determine a minimum value of the modeled quadratic function as the sixth optimum read voltage Votp6. The quadratic function modeling and the minimum value detection described above can be performed by the read management unit 111. The read management unit 111 can perform the quadratic function modeling and the minimum value detection on the basis of a regression analysis.

The memory controller 110 can model a threshold voltage distribution diagram of the memory cells by nth degree function (n is an integer which is 3 or more). In this case, the memory controller 110 can detect first through n+1th values to model a threshold voltage distribution diagram of the memory cells. For brevity of description, it is assumed that the memory controller 110 models a threshold voltage distribution diagram of the memory cells by a quadratic function. However, inventive concepts are not limited thereto.

Because of a rapid change of a threshold voltage of the memory cells, the memory cells may have a threshold voltage distribution such as illustrated in FIG. 6. In this case, the memory controller 110 can read the sample data SD1~SD4 based on the first through fourth sampling voltages Vs1~Vs4 and can detect the first through third values y1, y2 and y3 based on the read sample data SD1~SD4. As illustrated in FIG. 6, the first value y1 may be greater than the second value y2 and the second value y2 may be greater than the third value y3.

In this case, the memory controller 110 can perform an additional sampling operation. For example, the memory controller 110 can perform an additional sampling operation along an increasing direction of the sampling voltage. That is, the memory controller 110 can read fifth sample data SD5 based on a fifth sampling voltage Vs5 greater than the fourth sampling voltage Vs4. The memory controller 110 can detect a fourth value y4 based on the fourth and fifth sample data SD4 and SD5. The third value y3 may be smaller than the second value y2 and may be smaller than the fourth value y4. In this case, the memory controller 110 can model the threshold voltage distribution diagram by a quadratic function and can detect a minimum value.

There occurs a problem that as illustrated in FIG. 6, an optimum read level, although it is the sixth optimum read level Votp6, may detect a wrong read level due to a rapid threshold voltage change.

In an optimum read voltage detection operation, the memory controller 110, by setting a sampling direction on the basis of the number of on-cells with respect to a sampling start voltage, can solve a problem that the optimum read voltage is mistakenly detected. In example embodiments, the on-cells indicate memory cells being turned-on by a sampling voltage. For brevity of description and drawing, hereinafter the number of on-cells is referred to as 'on-cell count'. Below, the inventive concepts are described with reference to "on-cell count". However, the inventive concepts are not limited thereto. For example, the nonvolatile memory device may use "off-cell count" to perform following operations.

Figure 7:
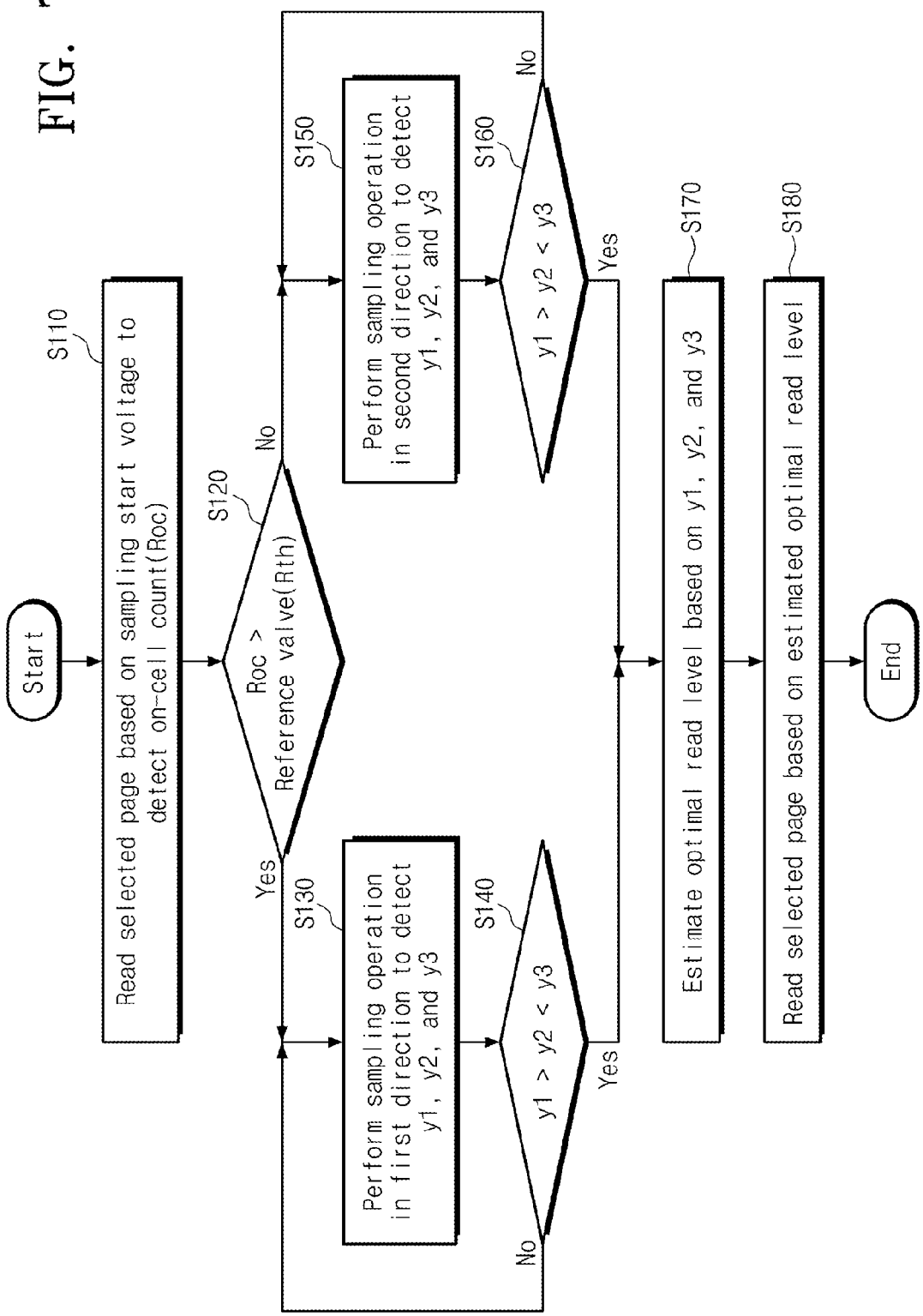
FIG. 7 is a flowchart illustrating an operation of a memory controller in accordance with example embodiments of inventive concepts.

FIG. 7 is a flowchart illustrating an operation of a memory controller in accordance with example embodiments of inventive concepts. In the case that data DATA read from the nonvolatile memory device 120 includes an error (e.g., UECC error) that cannot be corrected by an error correction circuit, an operation illustrated in FIG. 7 may be performed.

For brevity of description and drawing, the fifth through seventh program states P5'~P7 are illustrated in the drawings below and an operation of detecting the sixth optimum read voltage Vopt6 for distinguishing the sixth program state P6 is described. However, inventive concepts are not limited thereto and operations of detecting different optimum read voltages for distinguishing different program states may be similar to an operation method that will be described below.

Referring to FIGS. 1 and 7, in an operation S110, the memory controller 110 can read a selected page based on a start voltage (e.g., sampling start voltage) to detect an on-cell count Roc. For example, the memory controller 110 may include a bit counter (not shown). The memory controller 110 can detect data from the selected page on the basis of the start voltage. The data may include information on the on-cell count Roc of memory cells being turned on by the start voltage. The memory controller 110 can count the data to detect the on-cell count Roc (e.g., the number of memory cells having a threshold voltage lower than the start voltage). In example embodiments, the start voltage may be the first sampling voltage Vs1, and the data may be first sample data SD1.

In example embodiments, this operation may be referred as 'cell counting operation'. In other words, the cell counting operation may be an operation for counting the number of on-cell or off-cell among the plurality of memory cells based on a certain voltage. In example embodiments, a sampling direction may be determined by a result of the cell counting operation.

In an operation S120, the memory controller can determine whether the detected on-cell count Roc is greater than a corresponding reference value Rth. For example, the memory controller 110 can determine whether the detected on-cell count Roc is greater than a sixth reference value Rth6. The sixth reference value Rth6 indicates the number of memory cells having a threshold voltage lower than the sixth optimum read level. The sixth reference value Rth6 is a value previously determined on the basis of a randomizing operation of the randomizer 115 (refer to FIG. 2) and the number of memory cells connected to one word line. The reference value Rth6 is described with reference to FIG. 8.

In the case that the detected on-cell count Roc is greater than the reference value Rth, (e.g., Roc>Rth), in an operation S130, the memory controller 110 can perform a sampling operation along a first direction DIR1 to detect the first through third values y1, y2 and y3. The first direction DIR1 indicates a decreasing direction of the sampling voltage.

For example, in the case that the on-cell count Roc is greater than the reference value Rth, the memory controller 110 can set the first through fourth sampling voltages Vs1, Vs2, Vs3 and Vs4 as sampling voltages. The first through fourth sampling voltages Vs1, Vs2, Vs3 and Vs4 may be sampling voltages set to perform a sampling operation along the first direction DIR1.

The memory controller 110 can read the first through fourth sample data SD1~SD4 from a selected page along the first direction DIR1 based on the first through fourth sampling voltages Vs1~Vs4. The first sampling voltage Vs1 is a sampling start voltage, the second sampling voltage Vs2 is lower than the first sampling voltage Vs1, the third sampling voltage Vs3 is lower than the second sampling voltage Vs2 and the fourth sampling voltage Vs4 is lower than the third sampling voltage Vs3. That is, the memory controller 110 can perform a sampling operation based on sampling voltages lower than the first sampling voltage Vs1 which is the sampling start voltage.

The memory controller 110 can detect first through third values y1, y2 and y3 based on the read first through fourth sample data SD1~SD4.

In an operation S140, the memory controller 110 can compare the detected first through third values y1, y2 and y3. That is, the memory controller can determine whether the second value y2 is smaller than the first value y1 and is smaller than the third value y3.

In the case that the second value y2 is not smaller than the first value y1 or is not smaller than the third value y3, the memory controller 110 can redetect the first through third values y1, y2 and y3 by performing the operation S130 again. That is, in the case that the second value y2 is not smaller than the first value y1 or is not smaller than the third value y3, the memory controller 110 can perform an additional sampling operation along the first direction DIR1. At this time, the memory controller 110 can perform an additional sampling operation using sampling voltages lower than the first through fourth sampling voltages Vs1~Vs4. After that, the memory controller 110 can perform the operation S140 again. The memory controller 110 can repeatedly perform the operation S130 and the operation S140 until a condition of the operation S140 is satisfied. As the operation S130 is repeated, a sampling voltage being used may be lowered.

In the case that the determination result of the operation S120 indicates that the on-cell count Roc is not greater than the reference value Rth, (e.g., Roc<Rth) in an operation S150, the memory controller 110 can perform a sampling operation along a second direction DIR2 to detect the first through third values y1, y2 and y3. The second direction DIR2 indicates an increasing direction of the sampling voltage. For example, the memory controller 110 can read the first through fourth sample data SD1-SD4 from the selected page along the second direction DIR2 based on the first through fourth sampling voltages Vs1~Vs4. The first sampling voltage Vs1 is a sampling start voltage, the second sampling voltage Vs2 is higher than the first sampling voltage Vs1, the third sampling voltage Vs3 is higher than the second sampling voltage Vs2 and the fourth sampling voltage Vs4 is higher than the third sampling voltage Vs3. That is, the memory controller 110 can perform a sampling operation based on sampling voltages higher than the first sampling voltage Vs1 which is the sampling start voltage.

The memory controller 110 can detect the first through third values y1, y2 and y3 on the basis of the first through fourth sample data SD1~SD4.

In the operation S140, the memory controller 110 can compare the detected first through third values y1, y2 and y3. For example, the memory controller 110 can determine whether the second value y2 is smaller than the first value y1 and is smaller than the third value y3.

According to the determination result, the memory controller 110 can perform the operation S150 and an operation S160 in a similar manner to the operation described with reference to the operation S130 and the operation S140. In the case that the operation S150 and the operation S160 are repeatedly performed, as the operation S150 is repeatedly performed, a sampling voltage being used in the operation S150 may increase.

In the case that the determination result of the operation S140 or the operation S160 is that the second value y2 is smaller than the first value y1 and is smaller than the third value y3, in an operation S170, the memory controller 110 can estimate an optimum read voltage based on the first through third values y1, y2 and y3. For example, the memory controller 110 can model a threshold voltage distribution of an area in which an optimum read voltage is included by a quadratic function on the basis of the first through third values y1, y2 and y3 according to a regression analysis. The memory controller 110 can detect a minimum value of the modeled quadratic function. The memory controller 110 determines a voltage level corresponding to the detected minimum value as an optimum read voltage.

In an operation S180, the memory controller 110 can perform a read operation with respect to a selected page on the basis of the determined optimum read voltage. In example embodiments, the memory controller 110 can perform a read operation with respect to a selected page (or, selected memory cells) on the basis of a result of the sampling operation.

In example embodiments, the memory controller 110 can repeatedly perform the operations S110 through S170 to detect optimum read voltages with respect to a plurality of program states respectively. After the optimum read voltages with respect to the plurality of program states respectively are all detected, the memory controller 110 can perform the operation S180.

Figure 8:
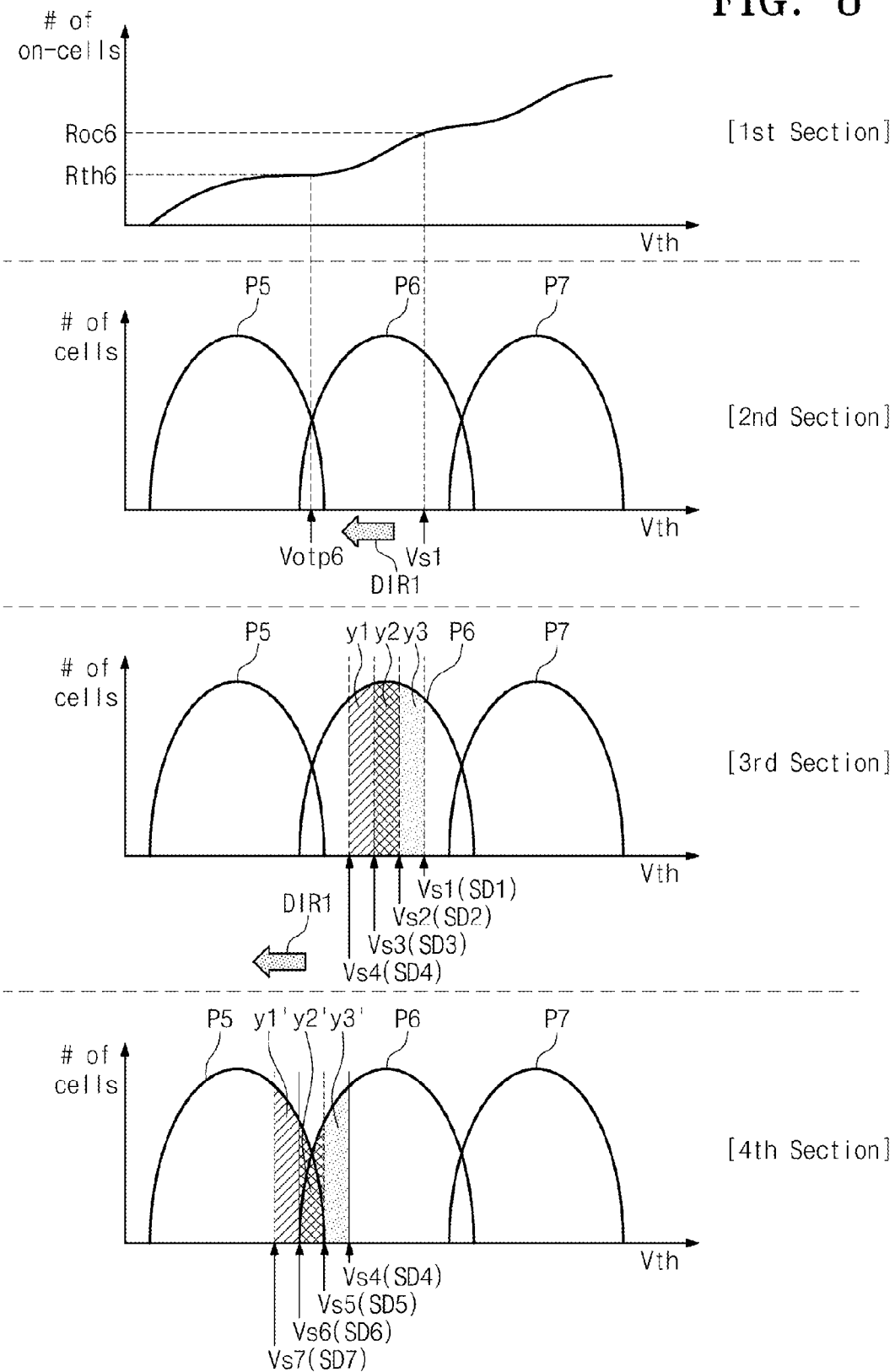
FIGS. 8 and 9 are drawings for explaining an operation method of FIG. 7 in detail.
Figure 9:
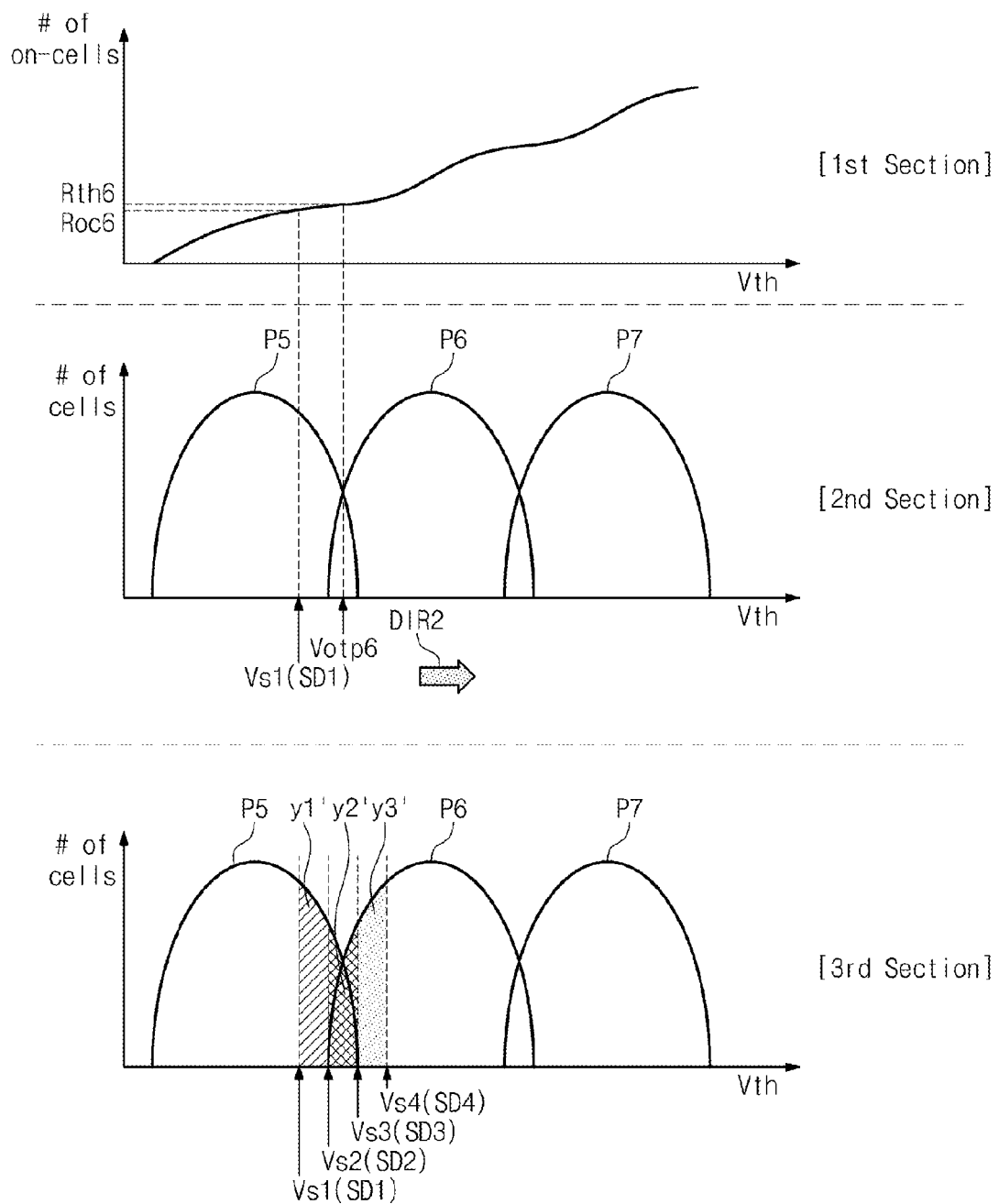

FIGS. 8 and 9 are drawings for explaining an operation method of FIG. 7 in detail. For brevity of description, unnecessary constituent elements when describing the sixth optimum read voltage Votp6 for determining the sixth program state P6 are omitted. However, inventive concepts are not limited thereto and similar methods may be applied to detect optimum read voltages for determining different program states.

In a graph of a first section of FIG. 8, an X axis indicates a threshold voltage and a Y axis indicates the on-cell count with respect to a threshold voltage. In graphs of second through fourth sections of FIG. 8, X axes indicate a threshold voltage and Y axes indicate the number of memory cells.

The graphs of the second through fourth sections are threshold voltage distribution diagrams of memory cells having the fifth through seventh program states P5~P7. The threshold voltage distribution diagrams may be expressed by a probability density function (PDF). The graph of the first section of FIG. 8 illustrates the on-cell count with respect to a threshold voltage included in the fifth through seventh program states P5~P7. The graph of the first section of FIG. 8 may be expressed by a cumulative density function (CDF) with respect to the probability density function (PDF) in accordance with the graphs of the second through fourth sections of FIG. 8.

Referring to FIGS. 1, 7 and 8, as illustrated in the second section of FIG. 8, the memory controller 110 can detect the sixth on-cell count Roc6 on the basis of the first sampling voltage Vs1. The sixth on-cell count Roc6 may be the number of memory cells turned on by the first sampling voltage Vs1. For example, the memory controller 110 can perform a read operation based on the first sampling voltage Vs1 to read the first sample data SD1. The memory controller 110 can count a bit of the first sample data SD1 to detect the sixth on-cell count Roc6.

As illustrated in the second section of FIG. 8, in the case that the detected sixth on-cell count Roc6 is greater than the sixth reference value Rth6, the memory controller 110 performs a sampling operation along the first direction DIR1. The sixth reference value Rth6 may indicate the number of memory cells having a threshold voltage lower than the sixth optimum read voltage Votp6. That is, the sixth reference value Rth6 may indicate the number of on-cells by the sixth optimum read voltage Votp6. The first direction DIR1 indicates a decreasing direction of a threshold voltage (or sampling voltage).

As illustrated in the third section of FIG. 8, the memory controller 110 can perform a sampling operation based on the first through fourth sampling voltages Vs1~Vs4 to detect the first through third values y1, y2 and y3. For example, the memory controller 110 can read the second sample data SD2 on the basis of the second sampling voltage Vs2 lower than the first sampling voltage Vs1 by a desired (and/or alternatively predetermined) level. The memory controller 110 can detect the third value y3 by performing an exclusive OR operation on the first and second sample data SD1 and SD2.

Similarly, the memory controller 110 can read the third and fourth sample data SD3 and SD4 on the basis of the third and fourth sampling voltages Vs3 and Vs4 to detect the second value y2 by performing an exclusive OR operation on the second and third sample data SD2 and SD3 and detect the first value y1 by performing an exclusive OR operation on the third and fourth sample data SD3 and SD4. The third sampling voltage Vs3 is lower than the second sampling voltage Vs2 by a desired (and/or alternatively predetermined) level and the fourth sampling voltage Vs4 is lower than the third sampling voltage Vs3 by a desired (and/or alternatively predetermined) level.

The first value y1 indicates the number of memory cells having a threshold voltage included between the fourth and third sampling voltages Vs4~Vs3, the second value y2 indicates the number of memory cells having a threshold voltage included between the third and second sampling voltages Vs3~Vs2 and the third value y3 indicates the number of memory cells having a threshold voltage included between the second and first sampling voltages Vs2~Vs1.

In example embodiments, the memory controller 110 can determine first through third values by calculating on-cell counts for each of the first through fourth sample data SD1 through SD4. For example, the memory controller 110 can determine the third value y3 by subtracting the on-cell count corresponding to the first sample data SD1 and the on-cell count corresponding to the second sample data SD2. Similarly, the memory controller 110 can determine the first and second values y1 and y2 by calculating each of on-cell counts corresponding to each of the second through fourth sample data SD2 through SD4. However, inventive concepts are not limited thereto.

Each of the first through third values y1, y2 and y3 may indicate an area corresponding to the third section of FIG. 8.

The memory controller 110 can compare the detected first through third values y1, y2 and y3. In the case that the second value y2 is greater than the first or third value y1 or y3, as illustrated in the fourth section of FIG. 8, the memory controller 110 performs an additional operation to detect the first through third values y1, y2 and y3 again. The memory controller 110 performs an additional sampling operation on the basis of sampling voltages lower than the first through fourth sampling voltages Vs1~Vs4.

The memory controller 110 can read the fifth sample data SD5 on the basis of the fifth sampling voltage Vs5 lower than the fourth sampling voltage Vs4 by a desired (and/or alternatively predetermined) level. Similarly, the memory controller 110 can read sixth and seventh sample data SD6 and SD7 on the basis of the sixth and seventh sampling voltages Vs6 and Vs7. The sixth sampling voltage Vs6 is lower than the fifth sampling voltage Vs5 and the seventh sampling voltage Vs7 is lower than the sixth sampling voltage Vs6.

The memory controller 110 can detect the first through third values y1', y2' and y3' based on the fourth through seventh sampling data SD4~SD7 again. For example, the memory controller 110 can perform an exclusive OR operation on the fourth and fifth sampling data SD4 and SD5 to detect the first value y1', can perform an exclusive OR operation on the fifth and sixth sampling data SD5 and SD6 to detect the second value y2' and can perform an exclusive OR operation on the sixth and seventh sampling data SD6 and SD7 to detect the third value y3'.

The memory controller 110 can compare the redetected first through third values y1', y2' and y3'. As illustrated in the fourth section of FIG. 8, in the case that the second value y2' is smaller than the first and third values y1' and y3', the memory controller 110 can detect the sixth optimum read voltage Votp6 on the basis of a regression analysis.

Although not illustrated in the drawings, in the case that the redetected second value y2' is greater than the first or third value y1' or y3', the memory controller 110 can further perform an additional sampling operation along the first direction DIR1.

The operation described with reference to the second section of FIG. 8 corresponds to operation S110 and operation S120 of FIG. 7. The operation described with reference to the third and fourth sections of FIG. 8 corresponds to operation S130 and operation S140 of FIG. 7.

Hereinafter, referring to FIG. 9, the operations S110, S120, S150 and S160 of FIG. 7 are described. In a graph of a first section of FIG. 9, an X axis indicates a threshold voltage and a Y axis indicates the on-cell count. In graphs of second and third sections of FIG. 9, X axes indicate a threshold voltage and Y axes indicate the on-cell count. Since description of graphs of first through third sections of FIG. 9 was described with reference to FIG. 8, the detailed description thereof is omitted.

Referring to FIGS. 1, 7 and 9, as illustrated in the first section and the second section of FIG. 9, the on-cell count Roc6 detected by the first sampling voltage Vs1 may be smaller than the sixth reference value Vth6. In this case, the memory controller 110 can perform a sampling operation along the second direction DIR2. The second direction DIR2 indicates an increasing direction of the threshold voltage or the sampling voltage.

As illustrated in the third section of FIG. 9, the memory controller 110 can perform a sampling operation based on the first through fourth sampling voltages Vs1~Vs4 to detect the first through third values y1, y2 and y3. In the case that a sampling operation is performed along the second direction DIR2, the first sampling voltage Vs1 is lower than the second sampling voltage Vs2, the second sampling voltage Vs2 is lower than the third sampling voltage Vs3 and the third sampling voltage Vs3 is lower than the fourth sampling voltage Vs4.

The memory controller can compare the detected first through third values y1, y2 and y3. As illustrated in the third section of FIG. 9, in the case that the second value y2 is smaller than the first and third values y1 and y3, the memory controller 110 can detect the sixth optimum read voltage Votp6 on the basis of the first through third values y1, y2 and y3.

Although not illustrated in FIG. 9, in the case that the detected second value y2 is greater than the first value y1 or third value y3, the memory controller 110 can further perform an additional sampling operation along the second direction DIR2.

According to example embodiments of inventive concepts, when an optimum read voltage is detected using a sampling scheme, a case of detecting a wrong optimum read voltage is reduced by comparing the on-cell count corresponding to a sampling start voltage with a reference value to select a sampling direction. Thus, a nonvolatile memory system having improved reliability is provided.

FIG. 10 are graphs illustrating a threshold voltage distribution of a plurality of memory cells connected to one word line and the number (e.g., on-cell counts) of corresponding on-cells. A probability density function (PDF) and a cumulative density function (CDF) with respect to a threshold voltage of a plurality of memory cells are illustrated in FIG. 10. A probability density function may correspond to a threshold voltage distribution diagram of the memory cells.

A first section of FIG. 10 illustrates graphs showing a threshold voltage distribution of memory cells in a normal state and a cumulative density function (e.g., a first line L01) corresponding thereto. A second section of FIG. 10 illustrates graphs showing a threshold voltage distribution of memory cells of which a threshold voltage is changed and a cumulative density function (e.g., a second line L02) corresponding thereto.

Referring to FIGS. 1 and 10, a plurality of memory cells connected to one word line may be a TLC (triple level cell) storing 3 bits. However, inventive concepts are not limited thereto.

Each of the memory cells may have an erase state E and first through seventh program states P1~P7. Randomized data may be stored in the memory cells. That is, among the memory cells, the number of memory cells having an erase state E, the number of memory cells having a first program state P1, the number of memory cells having a second program state P2, the number of memory cells having a third program state P3, the number of memory cells having a fourth program state P4, the number of memory cells having a fifth program state P5, the number of memory cells having a sixth program state P6 and the number of memory cells having a seventh program state P7 may be equal to one another.

That is, in the case of detecting the on-cell counts on the basis of a plurality of optimum read voltages Votp1~Votp7 for distinguishing the first through seventh program states P1~P7, the on-cell counts with respect to the optimum read voltages Votp1~Votp7 may be first through seventh reference values Rth1~Rth7.

Even if a threshold voltage of the memory cells is changed, the first through seventh reference values Rth1~Rth7 may not be changed, substantially. For example, in the case that a threshold voltage of memory cells having the seventh program state P7 is changed, and thereby the optimum read voltage for detecting the seventh program state P7 may be changed to the seventh optimum read voltage Votp7' as illustrated in the second section of FIG. 10. In this case, even if the on-cell count is detected by the changed seventh optimum read voltage Votp7', the on-cell count detected by the changed seventh optimum read voltage Votp7' may be almost the same as the on-cell count (e.g., Rth7) detected by the seventh optimum read voltage Votp7.

As illustrated by the first line L01 and the second line L02, in the case that randomized data is stored in the memory cells, even if the optimum read voltage is changed, the reference values for setting a sampling direction is not substantially changed. That is, as illustrated in FIG. 10, in the case that a threshold voltage of the memory cells is changed, a scale with respect to a threshold voltage of a cumulative density function is changed but a scale with respect to the on-cell count may be substantially maintained. That is, even if a threshold voltage of the memory cells is changed, a sampling direction can be accurately set based on the reference values.

Figure 11:
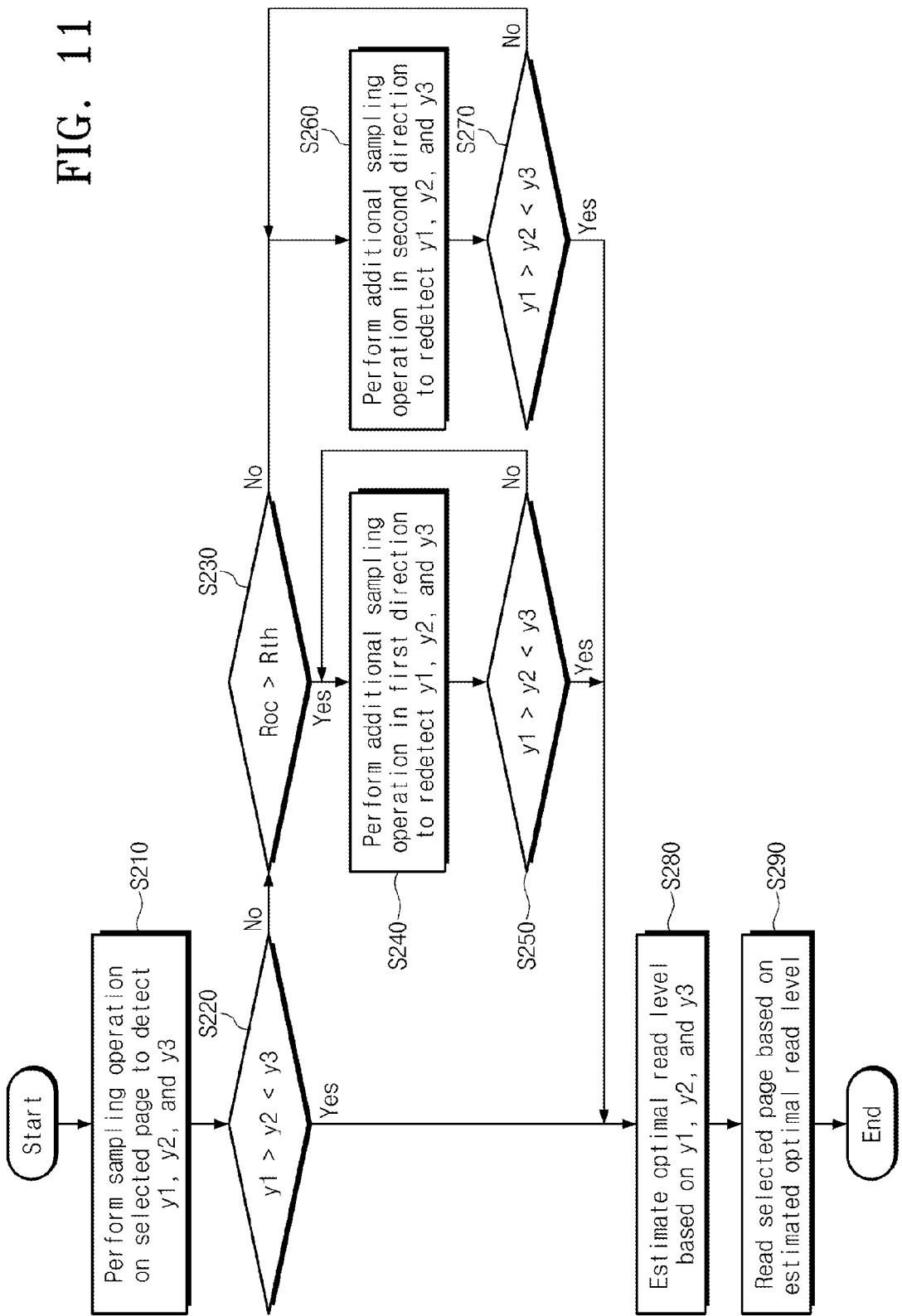
FIG. 11 is a flowchart illustrating an operation of a nonvolatile memory system in accordance with example embodiments of inventive concepts.

FIG. 11 is a flowchart illustrating an operation of a nonvolatile memory system in accordance with example embodiments of inventive concepts. Referring to FIGS. 1 and 11, in an operation S210, the memory controller 110 can perform a sampling operation on a selected page to detect the first through third values y1, y2 and y3. For example, the memory controller 110 can read the selected page based on desired (and/or alternatively predetermined) sampling voltages to detect the sixth optimum read voltage Votp6 for distinguishing the sixth program state P6. The memory controller 110 can detect the first through third values y1, y2 and y3 on the basis of a read result. Since the first through third values y1, y2, and y3 were described, a detailed description thereof is omitted. In example embodiments, in the case that data DATA read from the nonvolatile memory device 120 includes an UECC error, the memory controller 110 can start an operation of the operation S210.

In an operation S220, the memory controller 110 can compare the detected first through third values y1, y2 and y3. For example, the memory controller 110 can determine whether the second value y2 is smaller than the first and third values y1 and y3.

In the case that the second value y2 is not smaller than the first and third values y1 and y3 (that is, in the case that the second value y2 is greater than or equal to the first value y1 or the third value y3), in an operation S230, the memory controller 110 can compare the reference value with the on-cell count. For example, the memory controller 110 can compare the on-cell count corresponding to any one of the sampling voltages used in the operation S210 with a reference value corresponding to an optimum read voltage desired to be detected.

The memory controller 110 can detect the on-cell count corresponding to any one of the sampling voltages used in the operation S210. For example, the memory controller 110 can detect the on-cell corresponding to the highest sampling voltage among the sampling voltages used in the operation S210. The memory controller 110 can detect the on-cell count corresponding to the lowest sampling voltage among the sampling voltages used in the operation S210. However, inventive concepts are not limited thereto.

The on-cell count can be detected based on sample data SD read by any one sampling voltage of the sampling voltages used in the operation S210.

In the case that the on-cell count is greater than the reference value, the memory controller 110 performs an operation S240 and an operation S250. Since the operation S240 and the operation S250 are identical to the operation S130 and the operation S140 of FIG. 7, a detailed description thereof is omitted.

In the case that the on-cell count is smaller than the reference value, the memory controller 110 performs an operation S260 and an operation S270. Since the operation S260 and the operation S270 are identical to the operation S150 and the operation S160 of FIG. 7, a detailed description thereof is omitted.

In the case that a result of the determination of the operations S220, S250 or S270 indicates that the second value y2 is smaller than the first and third values y1 and y3, the memory controller 110 can perform an operation of an operation S280 and an operation S290. Since the operation S280 and the operation S290 are identical to the operation S170 and the operation S180 of FIG. 7, a detailed description thereof is omitted.

Unlike the operation method of FIG. 7, the operation method described in FIG. 11 compares the on-cell count with the reference value to set a sampling direction, when an addition sampling operation is required after performing a sampling operation. Thus, since when an additional sampling operation is required, a sampling direction is set by comparing the on-cell count with the reference value, a nonvolatile memory system having improved reliability is provided.

Figure 12:
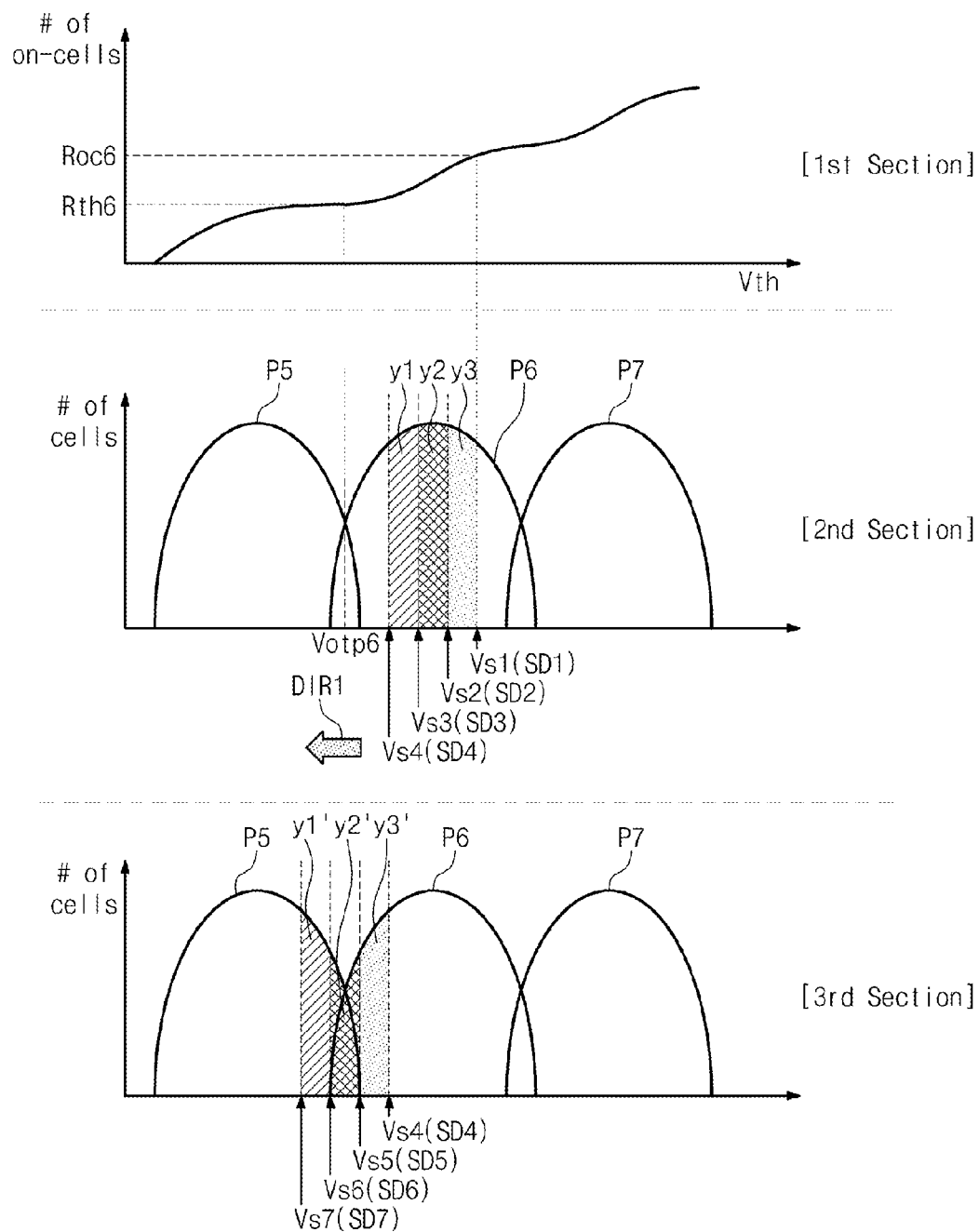
FIGS. 12 and 13 are drawings for explaining an operation of FIG. 11 in detail.
Figure 13:
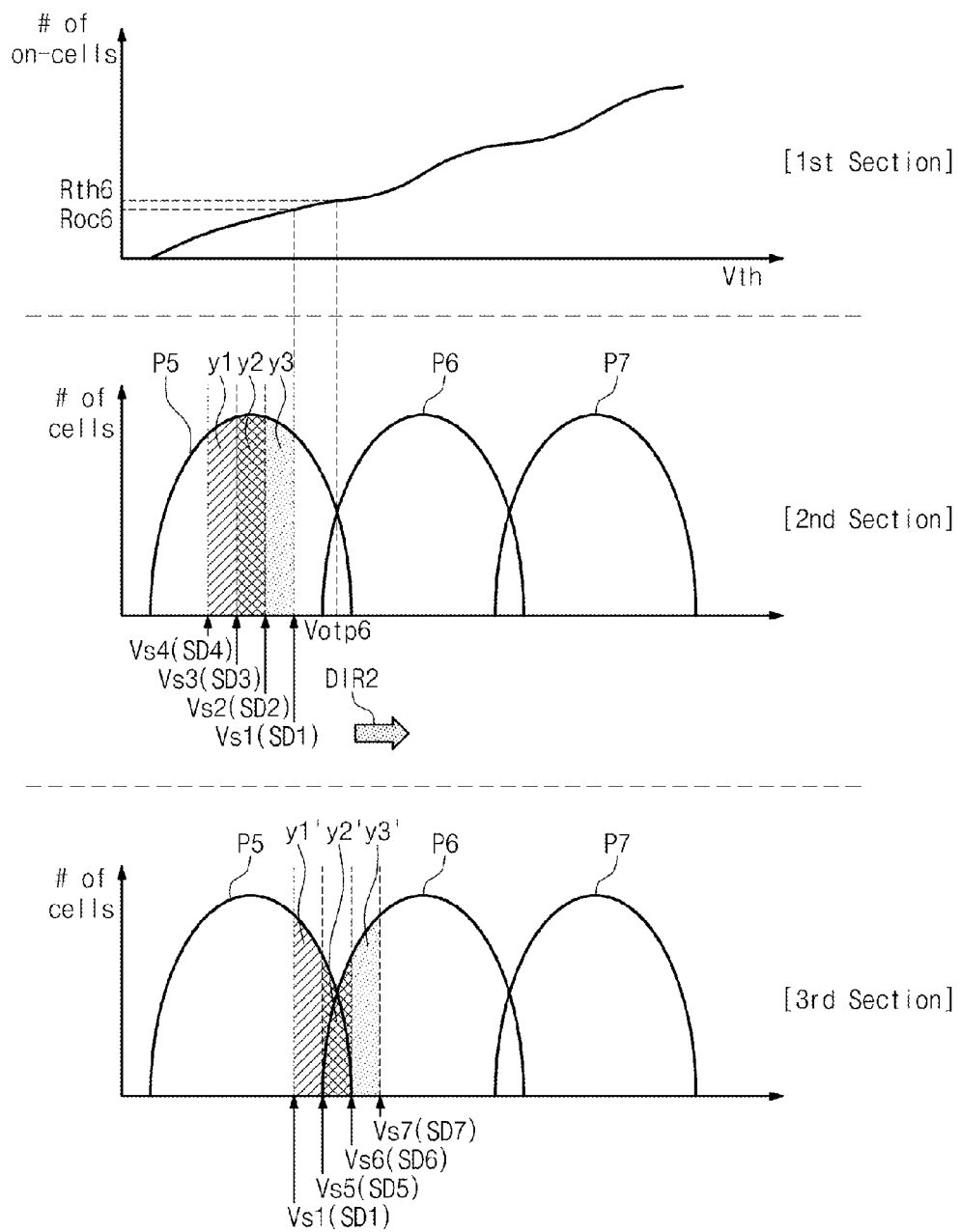

FIGS. 12 and 13 are drawings for explaining an operation of FIG. 11 in detail. For purposes of description, a detection operation with respect to the sixth optimum read voltage Votp6 for distinguishing the sixth program state P6 is described. However, inventive concepts are not limited thereto. Since graphs illustrated in first through third sections of FIGS. 12 and 13 were described with reference to FIGS. 8 through 10, a detailed description thereof is omitted.

Referring to FIGS. 1, 11 and 12, as illustrated in a second section of FIG. 12, the memory controller 110 can perform a sampling operation on the basis of the first through fourth sampling voltages Vs1~Vs4 to detect the first through third values y1, y2 and y3. The first value y1 indicates the number of memory cells having a threshold voltage included between the fourth and third sampling voltages Vs4~Vs3, the second value y2 indicates the number of memory cells having a threshold voltage included between the third and second sampling voltages Vs3~Vs2 and the third value y3 indicates the number of memory cells having a threshold voltage included between the second and first sampling voltages Vs2~Vs1.

The sixth reference value Rth6 may indicate the number of memory cells having a threshold voltage lower than the sixth optimum read voltage Votp6.

As illustrated in the second section of FIG. 12, in the case that the second value y2 is not smaller than the first and third values y1 and y3, the memory controller 110 performs an additional sampling operation. At this time, the memory controller 110 can compare the on-cell count based on sample data being read by the first sampling voltage Vs1 with the sixth reference value Rth6 to determine a sampling direction. For example, as illustrated in the second section of FIG. 12, in the case that the on-cell count Roc6 is greater than the sixth reference value Rth6, the memory controller 110 can perform an additional sampling operation along the first direction DIR1. The first direction DIR1 indicates a decreasing direction of the sampling voltages. The first direction DIR1 also indicates a lowering direction of the threshold voltage.

The memory controller 110, as illustrated in the third section of FIG. 12, can perform an additional sampling operation along the first direction DIR1 to redetect the first through third values y1', y2' and y3'. For example, the memory controller 110 can perform a sampling operation along the first direction DIR1 on the basis of the fourth through seventh sampling voltages Vs4~Vs7 to redetect first through third values y1', y2' and y3'.

As illustrated in the third section of FIG. 12, in the case that the redetected second value y2' is smaller than the first and third values y1' and y3', the memory controller 110 can detect the sixth optimum read voltage Votp6 on the basis of the first through third values y1', y2' and y3'.

The operation described with reference to FIG. 12 corresponds to operations S210, S220, S230, S240 and S250 of FIG. 11.

Although not illustrated in the drawing, the memory controller 110 can repeatedly perform an additional sampling operation along the first direction DIR1 until the redetected first through third values y1', y2' and y3' satisfy a specific condition (e.g., a condition that the second value is smaller than the first and third values). Whenever repeatedly performing an additional sampling operation, the memory controller 110 can compare the reference value with the on-cell count to set a sampling direction.

Referring to FIGS. 1, 11 and 13, as illustrated in the second section of FIG. 13, the memory controller 110 can perform a sampling operation on the basis of the first through fourth sampling voltages Vs1~Vs4 to detect the first through third values y1, y2 and y3.

Since the detected second value y2 is greater than the first or third value y1 or y3, the memory controller 110 can compare the sixth on-cell count Roc6 with the sixth reference value Rth6 to set a sampling direction. For example, the memory controller 110 can compare the on-cell count Roc6 corresponding to the first sampling voltage Vs1 with the sixth reference value Rth6. Since the on-cell count Roc6 corresponding to the first sampling voltage Vs1 is smaller than the sixth reference value Rth6, the memory controller 110, as illustrated in the third section of FIG. 13, can perform an additional sampling operation along the second direction DIR2. The second direction DIR2 indicates an increasing direction of the sampling voltage. The second direction DIR2 also indicates an increasing direction of the threshold voltage.

As described above, the memory controller 110 can compare the redetected first through third values y1', y2' and y3' to detect the sixth optimum read voltage Votp6. Although not illustrated in the drawing, the memory controller 110 can repeatedly perform an additional sampling operation along the second direction DIR2 until satisfying a specific condition (e.g., a condition that the second value is smaller than the first and third values).

The operation described with reference to FIG. 13 corresponds to the operations S210, S220, S230, S260 and S270 of FIG. 11.

In example embodiments described with reference to FIGS. 11 through 13, it was described that the on-cell count Roc6 corresponding to the first sampling voltage Vs1 and the sixth reference value Rth6 are compared with each other. However, inventive concepts are not limited thereto. The memory controller 110 can compare the on-cell count corresponding to any one of the sampling voltages with the reference value.

According to example embodiments of inventive concepts, the nonvolatile memory system 100 can detect an optimum read voltage on the basis of a repetitive sampling operation. When performing an additional sampling operation, the nonvolatile memory system 100 can compare the on-cell count with a corresponding reference value to set a sampling direction. Thus, a nonvolatile memory system having improved reliability is provided.

Figure 14:
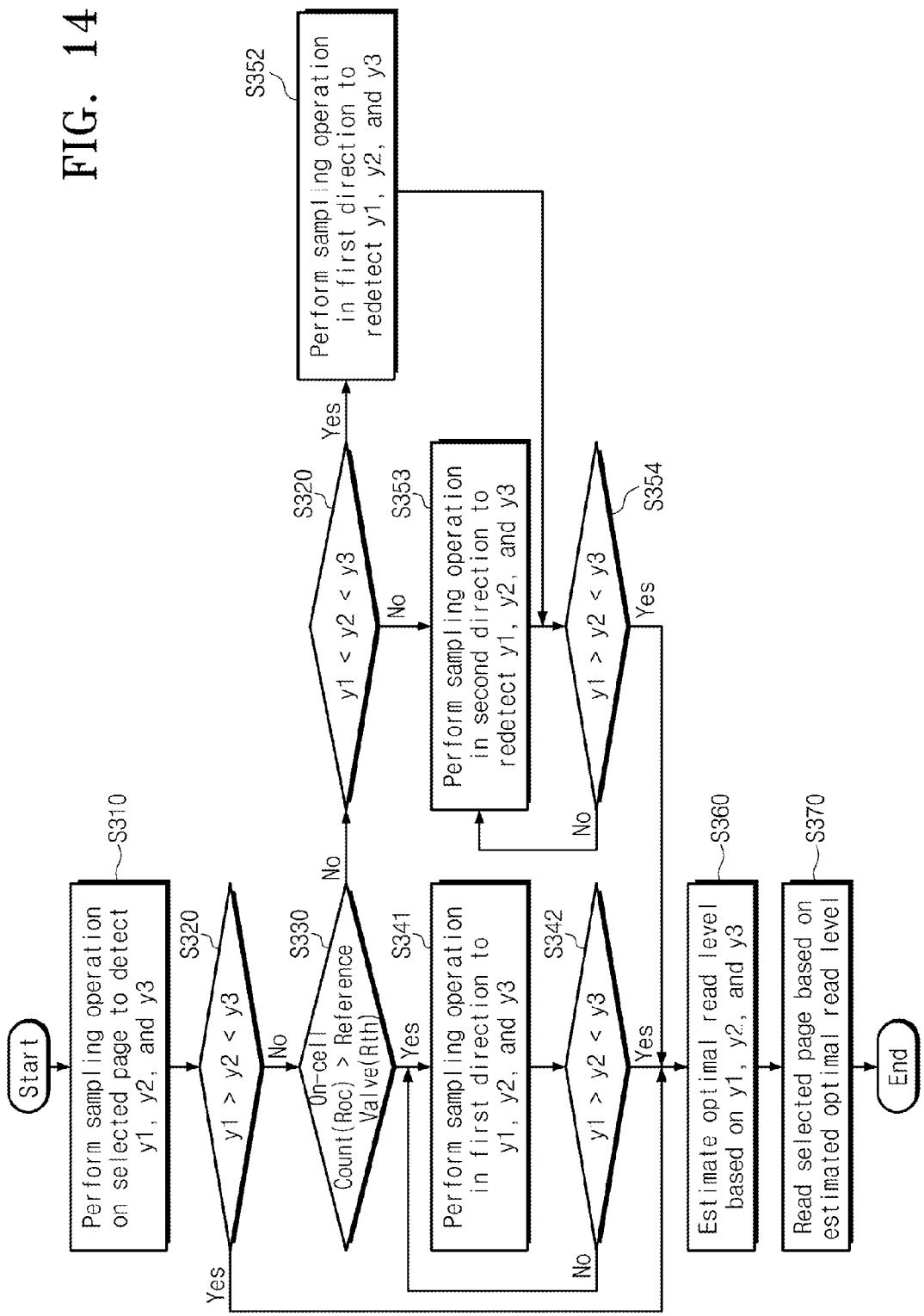
FIG. 14 is a flowchart an operation of a memory controller in accordance with example embodiments of inventive concepts.

FIG. 14 is a flowchart showing an operation of a memory controller in accordance with example embodiments of inventive concepts. For brevity of description, a detailed description for the operation and the constituent elements described with reference to FIGS. 1 through 13 is omitted.

An operation of FIG. 14 uses a different reference value from the operations described with reference to FIGS. 7 through 13. For example, the operation of FIG. 14 uses the number of memory cells having a threshold voltage lower than a voltage corresponding to a peak value of a specific program state as a reference value while the operations described with reference to FIGS. 7 through 13 uses the number of memory cells having a threshold voltage lower than an optimum read voltage (e.g., a valley value) for distinguishing a specific program state as a reference value. For brevity of description, the voltage corresponding to the peak value of the specific program state is referred to as "peak voltage".

Referring to FIGS. 1 and 14, since an operation S310 and an operation S320 are the same as the operation S210 and the operation S220 of FIG. 11, a detailed description thereof is omitted.

In an operation S330, the memory controller 110 can compare an on-cell count with a reference value. For example, the on-cell count may be the number of memory cells turned-on by any one of the sampling voltages used in the operation S310. The reference value may indicate the number of memory cells having a threshold voltage lower than a peak voltage of a specific program state (that is, a program state distinguished by an optimum read voltage wanted to be detected).

In the case that the on-cell count is greater than the reference value, the memory controller 110 can perform an operation S341 and an operation S342. Since the operation S341 and the operation S342 are the same as the operation S240 and the operation S250 of FIG. 11, a detailed description thereof is omitted.

The memory controller 110 can repeatedly perform the operation S341 and the operation S342 until a condition (e.g., y1>y2<y3) of the operation S342 or the desired (and/or alternatively predetermined) number of times.

In the case that the on-cell count is not greater than the reference value, in an operation S351, the memory controller 110 can compare the first through third values y1, y2 and y3.

For example, the memory controller 110 can determine whether the third value y3 is greater than the second value y2 and the second value y2 is greater than the first value y1. The first value y1 is a value detected based on sampling voltages lower than sampling voltages detecting the second value y2 and the second value y2 is a value detected based on sampling voltages lower than sampling voltages that detecting the third value y3.

In the case that the third value y3 is greater than the second value y2 and the second value y2 is greater than the first value y1, in an operation S352, the memory controller 110 can perform an additional sampling operation along the first direction DIR1 to redetect the first through third values y1, y2 and y3. The first direction DIR1 indicates a decreasing direction of the sampling voltage.

In the case that the third value y3 is not greater than the second value y2 or the second value y2 is not greater than the first value y1, in an operation S353, the memory controller 110 can perform an additional sampling operation along the second direction DIR2 to redetect the first through third values y1, y2 and y3. The second direction DIR2 indicates an increasing direction of the sampling voltage.

In an operation S354, the memory controller 110 can compare the first through third values y1, y2 and y3 redetected in the operation S352 or the operation S353. For example, the memory controller 110 can determine whether the redetected second value y2 is smaller than the redetected first and third values y1 and y3.

In the case that the second value y2 is not smaller than the first value y1 and the third value y3, the memory controller 110 performs the operation S351 again.

In the case that it is determined that in the operations S320, S342 or S354, the second value y2 is lower than the first and third values y1 and y3, the memory controller 110 performs an operation S360 and an operation S370. Since the operation S360 and the operation S370 were described with reference to the operation S170 and the operation S180 of FIG. 7, a detailed description thereof is omitted.

According to example embodiments of inventive concepts described above, the nonvolatile memory system 100 compares an on-cell count with a reference value to set a sampling direction. At this time, the reference value indicates the number of memory cells having a threshold voltage lower than a peak voltage of a specific program state (that is, a program state distinguished by an optimum read voltage wanted to be detected). Thus, a nonvolatile memory system having improved reliability is provided.

Figure 15:
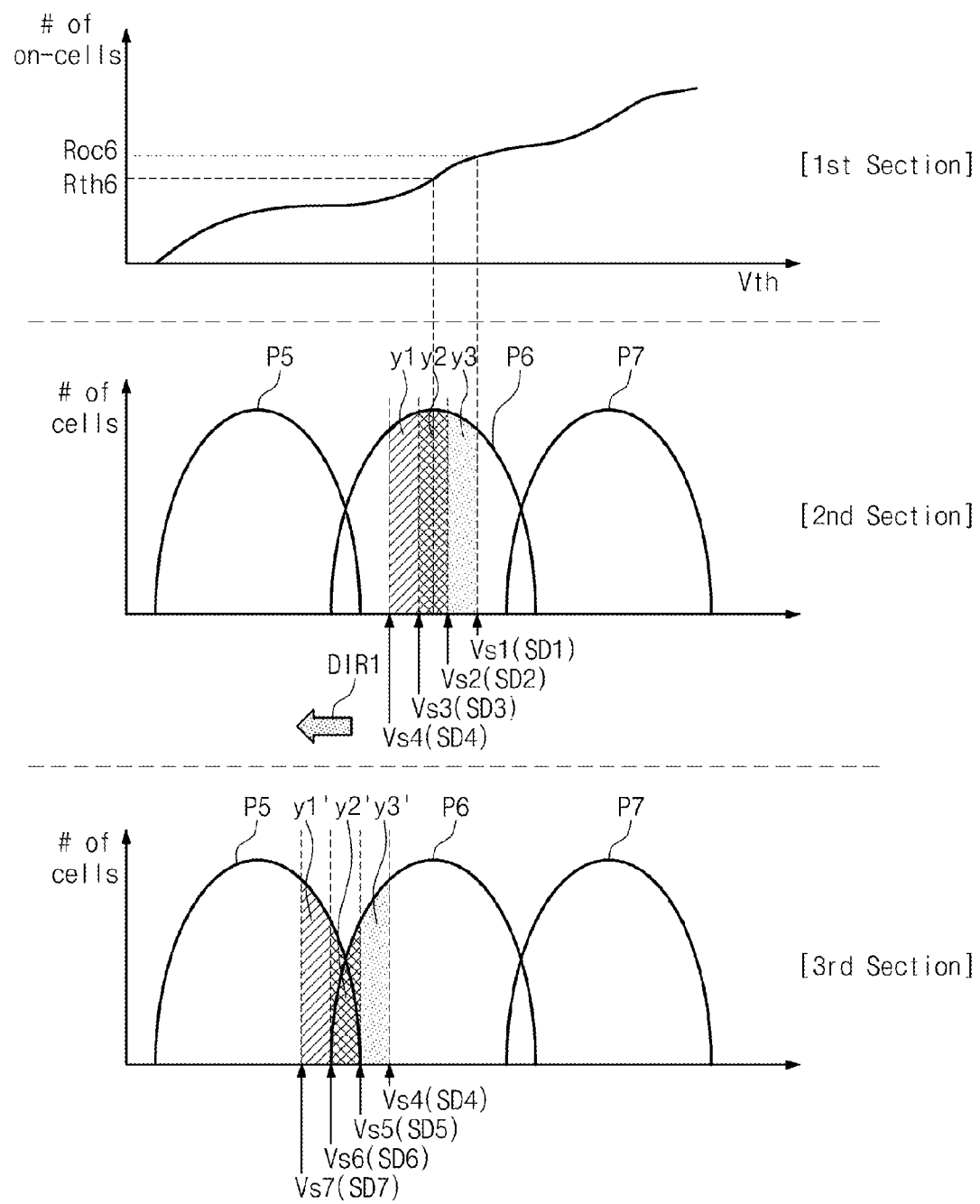
FIGS. 15 through 17 are drawings for explaining an operation method of FIG. 14.
Figure 16:
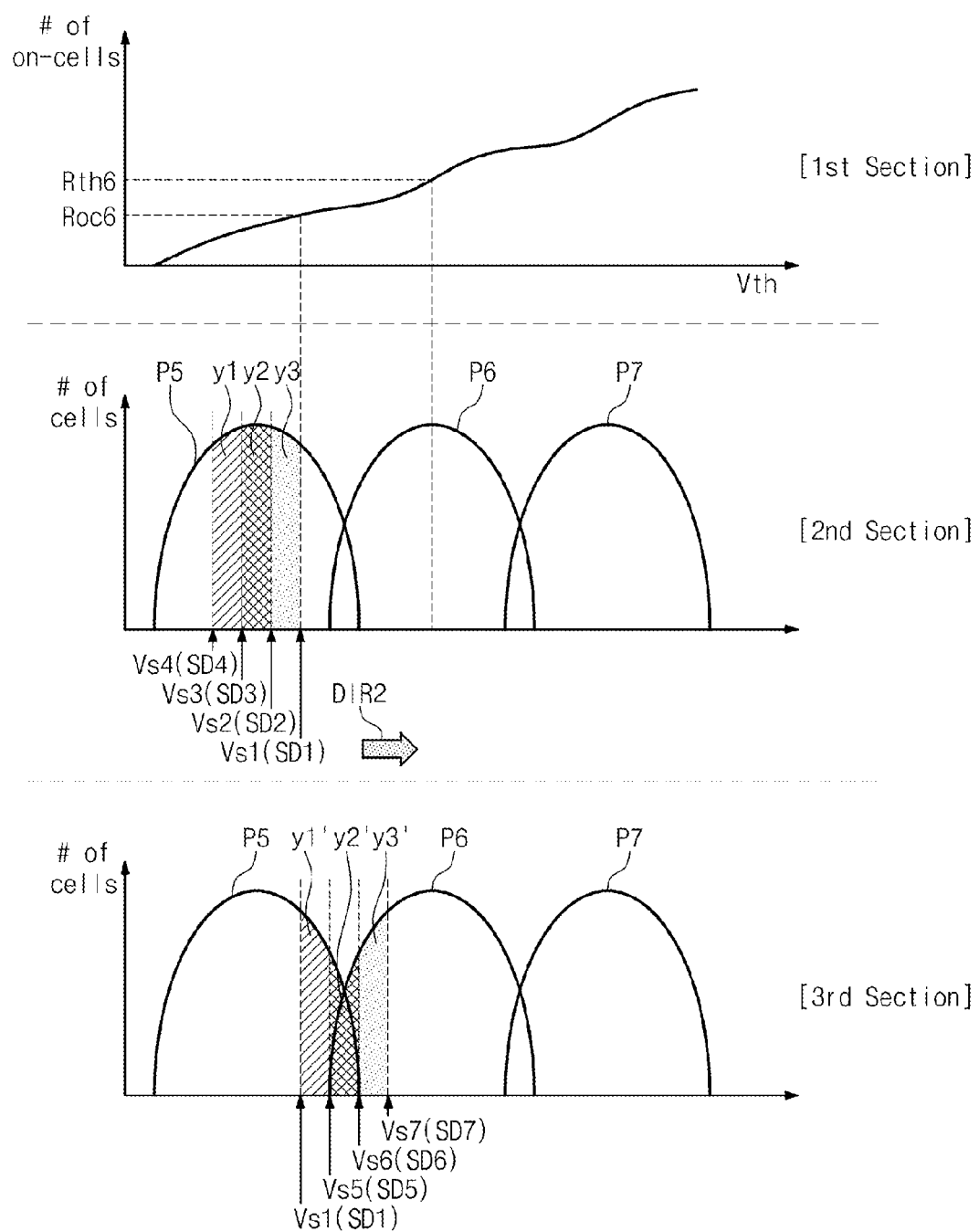
Figure 17:
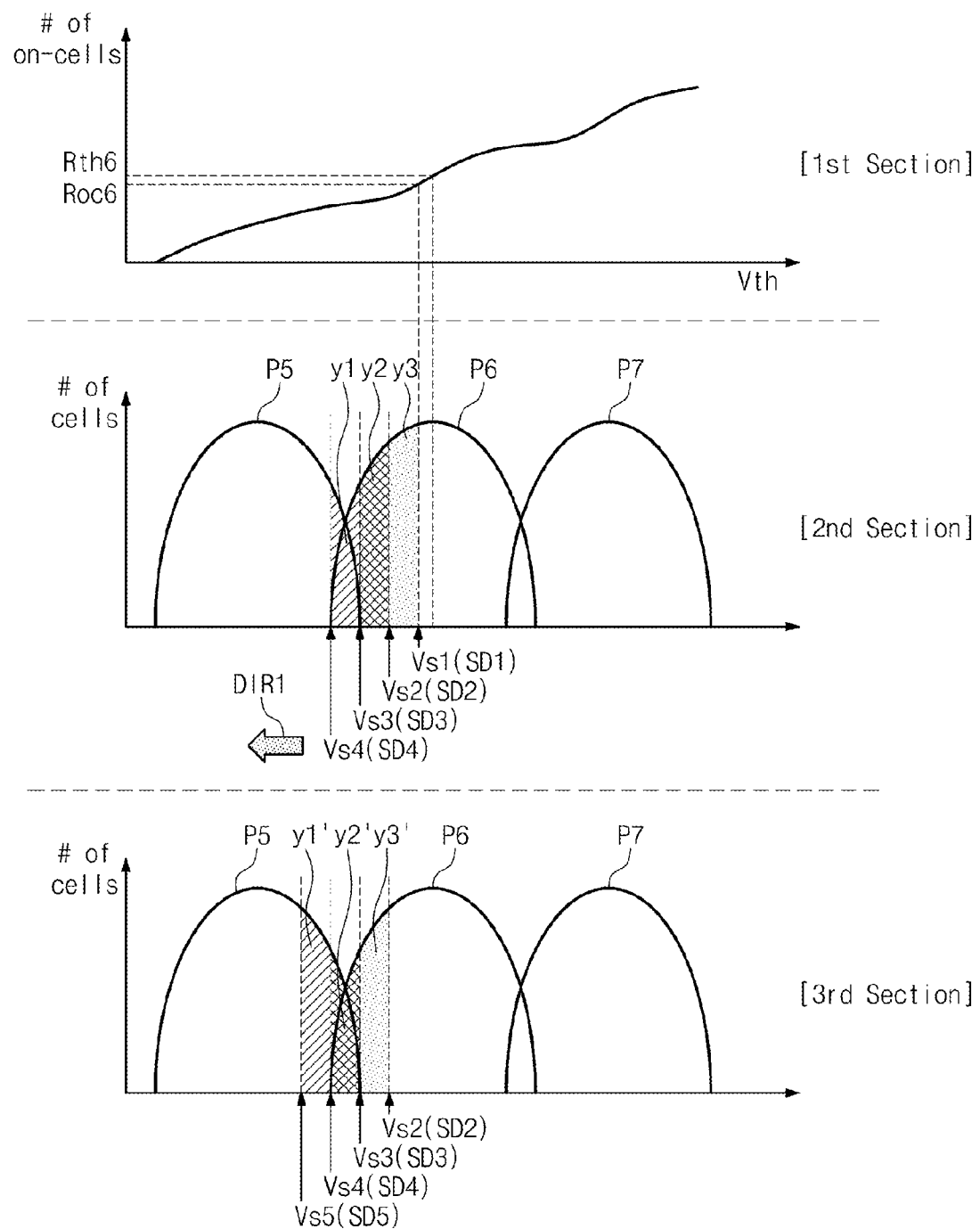

FIGS. 15 through 17 are drawings for explaining an operation method of FIG. 14. For brevity of description, a detailed description of constituent elements which do not need to describe the operation of FIG. 14 and the constituent elements described above is omitted.

Since the graphs illustrated in FIGS. 15 through 17 were described with reference to FIGS. 8, 9, 12 and 13, a detailed description thereof is omitted.

An on-cell count is the number of memory cells turned-on by the first sampling voltage Vs1 which is the highest voltage among the first through fourth sampling voltages Vs1~Vs4 and the sixth reference value Rth6 indicates the number of memory cells having a threshold voltage lower than a peak voltage of the sixth program state P6.

Referring to FIGS. 1, 14 and 15, as illustrated in a second section of FIG. 15, the memory controller 110 can perform a sampling operation on the basis of the first through fourth sampling voltages Vs1~Vs4 to detect first through third values y1, y2 and y3.

As illustrated in the second section of FIG. 15, since the second value y2 is greater than the first or third value y1 or y3, the memory controller 110 can compare the on-cell count Roc6 with the sixth reference value Rth6.

In the case that the on-cell count Roc6 is greater than the sixth reference value Rth6, as illustrated in a third section of FIG. 15, the memory controller 110 can perform an additional sampling operation along the first direction DIR1 to redetect first through third values y1', y2' and y3'. The first direction DIR1 indicates a decreasing direction of the sampling voltage. For example, the memory controller 110 can perform an additional sampling operation on the basis of fifth through seventh sampling voltages Vs5~Vs7 lower than the first through fourth sampling voltages Vs1~Vs4 to redetect first through third values y1', y2' and y3'. After that, the memory controller 110 can compare the first through third values y1', y2' and y3' to perform an additional sampling operation or an optimum read voltage detection.

The operation of FIG. 15 corresponds to the operations S310, S320, S330, S341 and S342 of FIG. 14.

Referring to FIGS. 1, 14 and 16, as illustrated in a second section of FIG. 16, the memory controller 110 can perform a sampling operation on the basis of the first through fourth sampling voltages Vs1~Vs4 to detect first through third values y1, y2 and y3.

As illustrated in the second section of FIG. 16, in the case that the second value y2 is greater than the first or third value y1 or y3, the memory controller 110 can compare the on-cell count Roc6 with the sixth reference value Rth6.

In the case that the on-cell count Roc6 is smaller than the sixth reference value Rth6, the memory controller 110 can compare the first through third values y1, y2 and y3. As illustrated in the second section of FIG. 16, since the third value y3 is not greater than the second value y2, the memory controller 110 can perform an additional sampling operation along the second direction DIR2 to redetect first through third values y1', y2' and y3'. For example, the memory controller 110 can perform an additional sampling operation on the basis of fifth through seventh sampling voltages Vs5~Vs7 higher than the first through fourth sampling voltages Vs1~Vs4 to redetect the first through third values y1', y2' and y3'.

The memory controller 110 can perform an additional sampling operation or detect the sixth optimum read voltage Votp6 on the basis of the redetected first through third values y1', y2' and y3'.

The operation described with reference to FIG. 16 corresponds to the operations S310, S320, S330, S351, S353 and S354 of FIG. 14.

Referring to FIGS. 1, 14 and 17, as illustrated in a second section of FIG. 17, the memory controller 110 can perform a sampling operation on the basis of the first through fourth sampling voltages Vs1~Vs4 to detect first through third values y1, y2 and y3.

As illustrated in the second section of FIG. 17, in the case that the on-cell count Rth6 is smaller than the reference value Rth6, the third value y3 is greater than the second value y2 and the second value y2 is greater than the first value y1, the memory controller 110 can perform an additional sampling operation along the first direction DIR1.

For example, the memory controller 110 can perform an additional sampling operation on the basis of a fifth sampling voltage Vs5 lower than the first through fourth sampling voltages Vs1~Vs4 to redetect the first through third values y1', y2' and y3'. The memory controller 110 can perform an additional sampling operation or detect the sixth optimum read voltage Votp6 on the basis of the redetected first through third values y1', y2' and y3'.

The operation described with reference to FIG. 17 corresponds to the operations S310, S320, S330, S351, S352 and S354 of FIG. 14.

According to example embodiments of inventive concepts, the nonvolatile memory system 100 can compare the on-cell count with the reference value to set a sampling direction. Thus, a nonvolatile memory system having improved reliability is provided.

Figure 18:
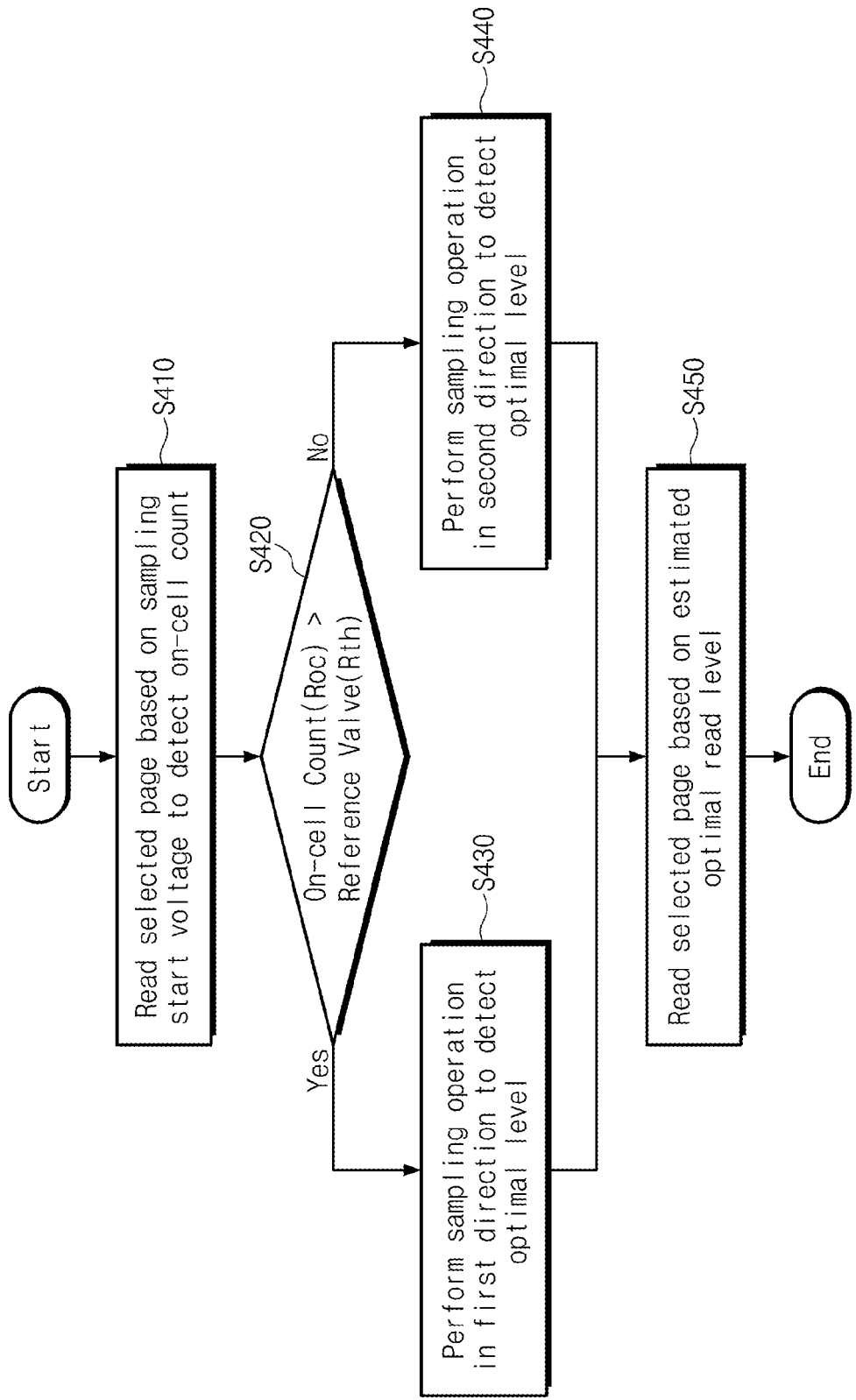
FIG. 18 is a flowchart an operation of a memory controller in accordance with example embodiments of inventive concepts.

FIG. 18 is a flowchart an operation of a memory controller in accordance with example embodiments of inventive concepts. For brevity of description, a detailed description of the constituent elements described above is omitted.

Referring to FIGS. 1 and 18, the memory controller 110 can perform an operation S410 and an operation S420. Since the operation S410 and the operation S420 were described with reference to the operation S110 and the operation S120 of FIG. 7, a detailed description thereof is omitted.

In the case that the on-cell count Roc is greater than the reference value Rth, in an operation S430, the memory controller 110 can perform a sampling operation along the first direction DIR1 to detect an optimum read voltage.

In the case that the on-cell count Roc is smaller than the reference value Rth, in an operation S440, the memory controller 110 can perform a sampling operation along the second direction DIR2 to detect an optimum read voltage.

In the operation S430 and the operation S440, an optimum read voltage can be detected by a different method from a regression analysis. The operation S430 will be described in more detail with reference to FIG. 19. The operation S440 may be performed based on a method similar to the method that will be described with reference to FIG. 19.

After that, the memory controller 110 can perform an operation S450. Since the operation S450 is the same as the operation S180 of FIG. 7, a detailed description thereof is omitted.

Figure 19:
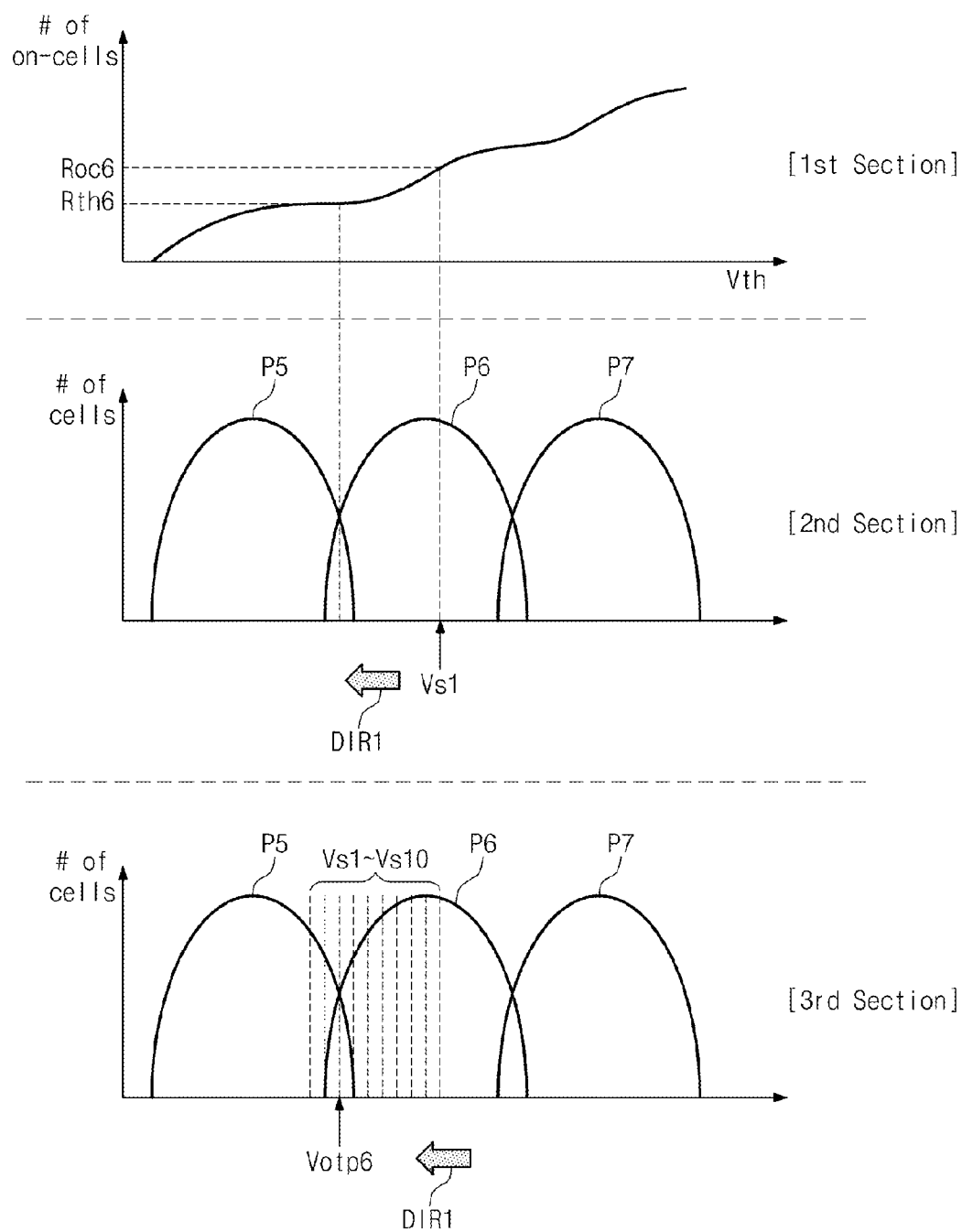
FIG. 19 is a drawing for explaining an operation S430 of FIG. 18.

FIG. 19 is a drawing for explaining an operation S430 of FIG. 18. For brevity of description, since graphs of FIG. 19 were described with reference to FIGS. 8 and 9, a detailed description thereof is omitted.

Referring to FIGS. 1, 18 and 19, the memory controller 110, as illustrated in a second section of FIG. 19, can compare the on-cell count Roc with the sixth reference value Rth6 to determine a sampling direction.

For example, in the case that the on-cell count Roc is smaller than the sixth reference value Rth6, the memory controller 110 can sequentially perform a sampling operation along the first direction DIR1 on the basis of a plurality of sampling voltages Vs. The first direction DIR1 indicates a decreasing direction of the sampling voltage.

The memory controller 110 can detect a section in which a detected value is changed depending on a sampling result. For example, a difference between on-cell counts detected by first and second sampling voltages Vs1 and Vs2 may be greater than a difference between on-cell counts detected by second and third sampling voltages Vs2 and Vs3. The difference between on-cell counts detected by second and third sampling voltages Vs2 and Vs3 may be greater than a difference between on-cell counts detected by third and fourth sampling voltages Vs3 and Vs4. That is, a difference of on-cell counts detected based on the first through seventh sampling voltages Vs1~Vs7 may be sequentially reduced.

After that, a difference between on-cell counts detected by seventh and eighth sampling voltages Vs7 and Vs8 may be smaller than a difference between on-cell counts detected by eighth and ninth sampling voltages Vs8 and Vs9. That is, in a specific section, a change amount of a difference of on-cell counts may be changed from a decrease to an increase. The memory controller 110 can detect a section in which a change amount of a difference of the number of on-cells is changed from a decrease to an increase and any one of sampling voltages corresponding to the detected section may be set as an optimum read voltage.

Although not illustrated in the drawing, in the case that an on-cell count is smaller than the reference value, the memory controller 110 can perform a sampling operation along the second direction DIR2 on the basis of a method similar to the method described above to detect an optimum read voltage. The second direction DIR2 indicates an increasing direction of the sampling voltage.

According to example embodiments of inventive concepts described above, the memory controller 110 can compare the number of on-cells with the reference value to set a sampling direction and can perform a sampling operation along the set direction to detect an optimum read operation.

The operation method described with reference to FIGS. 1 through 19 can be performed in the case that data DATA read from the nonvolatile memory device 120 includes a UECC error. The memory controller 110 can control the sampling voltages Vs to receive sample data SD from the nonvolatile memory device 120 and can perform an arithmetic operation being required in the operation described with reference to FIGS. 1 through 19. However, inventive concepts are not limited thereto.

Figure 20:
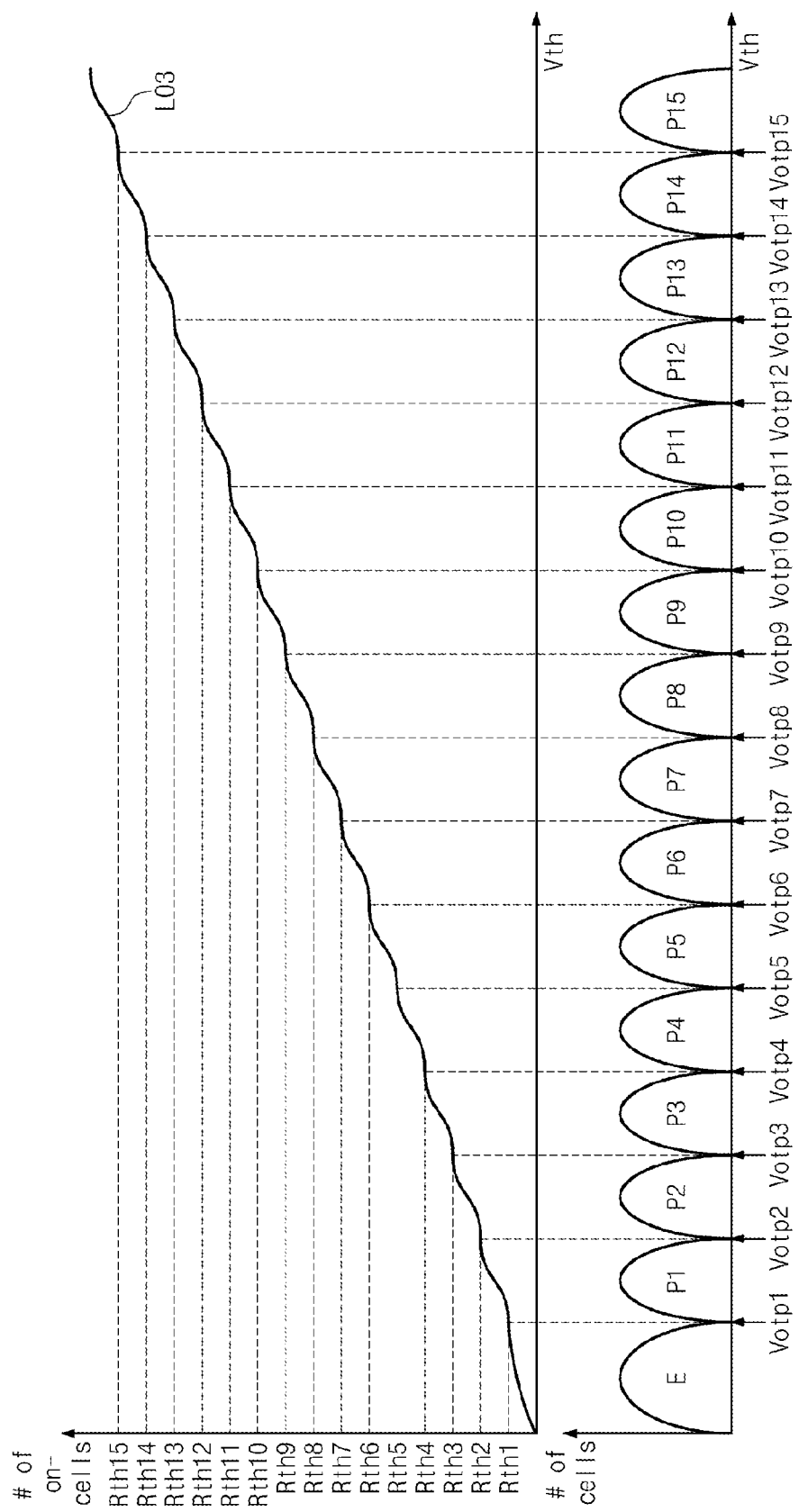
FIG. 20 is a drawing for explaining an operation method of a memory device according to example embodiments of inventive concepts.

FIG. 20 is a drawing for explaining an operation method of a memory device according to example embodiments of inventive concepts. Referring to FIGS. 1 and 20, each of memory cells included in the nonvolatile memory device 120 may be a QLC (quad level cell) storing 4 bits. The memory cells may be programmed to have any one state among a plurality of program states P1~P15.

As described with reference to FIG. 20, the number of on-cells with respect to a threshold voltage of the memory cells may be the same as a third line L03 and the third line L03 may be expressed by a cumulative density function. Example embodiments of inventive concepts described above may also be applied to the nonvolatile memory device 120 including a QLC (quad level cell).

For example, each of a plurality of reference values Rth1~Rth15 may indicate the number of on-cells with respect to each of a plurality of optimum read voltages Votp1~Votp15. To detect the optimum read voltages Votp1~Votp15, the memory controller 110 can set a sampling direction by comparing the on-cell count with a corresponding reference value.

Figure 21:
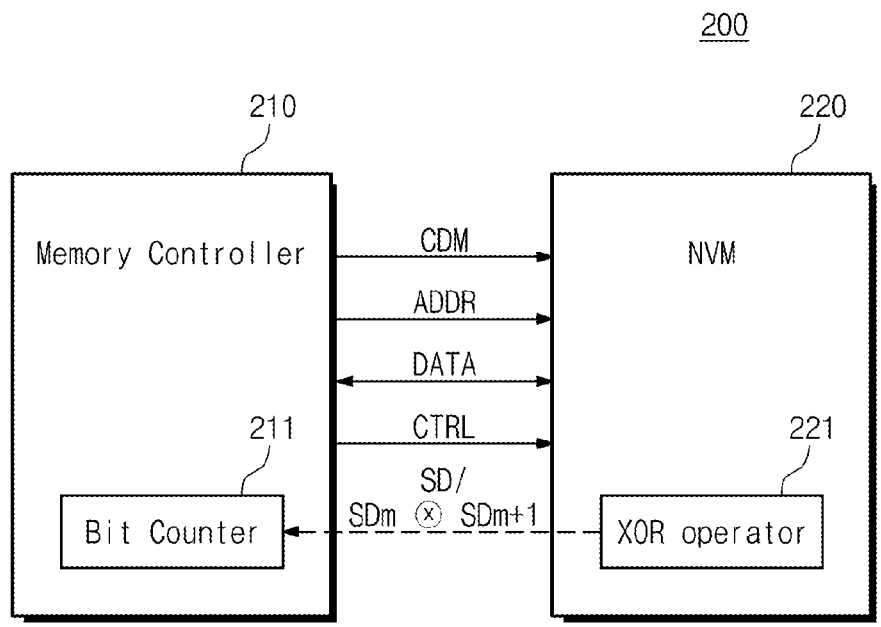
FIG. 21 is a block diagram illustrating a nonvolatile memory system in accordance with example embodiments of inventive concepts.

FIG. 21 is a block diagram illustrating a nonvolatile memory system in accordance with example embodiments of inventive concepts. Referring to FIG. 21, a nonvolatile memory system 200 includes a memory controller 210 and a nonvolatile memory device 220.

The memory controller 210 can transmit a command CMD, an address ADDR, and a control signal CTRL to the nonvolatile memory device 220 to control the nonvolatile memory device 220. The nonvolatile memory device 220 can write data DATA in response to received signals and/or can transmit data DATA to the memory controller 210.

In example embodiments of inventive concepts described with reference to FIGS. 1 through 19, the memory controller 110 receives sample data SD from the nonvolatile memory device 120 and performs a series of arithmetic operations being required to detect an optimum read voltage on the basis of the received sample data SD. Unlike that, the nonvolatile memory device 220 includes an exclusive OR operator 221. The nonvolatile memory device 220 reads sample data SD under the control of the memory controller 210 and can transmit data (SDm$\oplus$SDm+1) obtained by performing an exclusive OR operation on the read sample data SD to the memory controller 210.

The memory controller 210 can detect values such as the first through third values y1, y2 and y3 described with reference to FIGS. 1 through 19 by counting a bit of data (SDm$\oplus$SDm+1) obtained by performing an arithmetic operation using a bit counter 211. For example, the bit counter 211 can detect values such as the first through third values y1, y2 and y3 described with reference to FIGS. 1 through 19 by counting a bit of data (SDm$\oplus$SDm+1) obtained by performing an arithmetic operation.

The exclusive OR operator (XOR) 221 may be included in a page buffer (not illustrated) included in the nonvolatile memory device 220. The nonvolatile memory device 220 can perform an exclusive OR operation on sample data SD by controlling the page buffer.

To perform a sampling operation, the memory controller 210 can transmit a dedicated command (or vender command) to the nonvolatile memory device 220.

Figure 22:
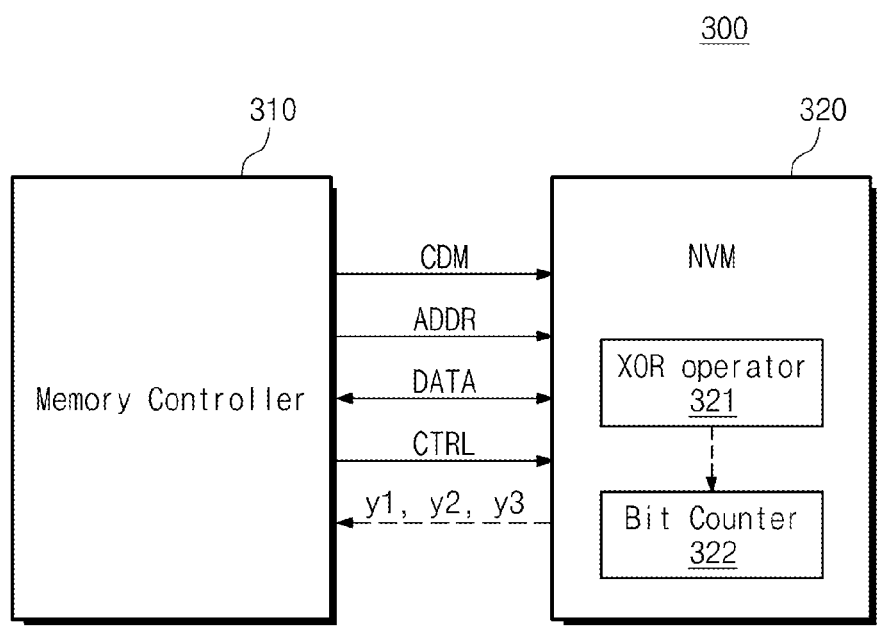
FIG. 22 is a block diagram illustrating a nonvolatile memory system in accordance with example embodiments of inventive concepts.

FIG. 22 is a block diagram illustrating a nonvolatile memory system in accordance with example embodiments of inventive concepts. Referring to FIG. 22, a nonvolatile memory system 300 includes a memory controller 310 and a nonvolatile memory device 320. Since the memory controller 310, the nonvolatile memory device 320 and an exclusive OR operator 321 were described with reference to FIG. 21, a detailed description thereof is omitted.

Unlike the nonvolatile memory device 220 of FIG. 21, the nonvolatile memory device 320 of FIG. 22 further includes a bit counter 322. That is, the nonvolatile memory device 320 reads sample data SD on the basis of sampling voltages under the control of the memory controller 310 and can perform an exclusive OR operation on the read sample data. The bit counter 322 of the nonvolatile memory device 320 can count a bit of the exclusive OR operated sample data to transmit first through third values y1, y2 and y3 to the memory controller 310.

That is, the nonvolatile memory device 320 can detect the first through third values y1, y2 and y3 described with reference to FIGS. 1 through 19 to transmit information about the first through third values y1, y2 and y3 to the memory controller 310.

The memory controller 310 can perform an additional sampling operation or an optimum read voltage detection on the basis of the method described with reference to FIGS. 1 through 19 and the received first through third values y1, y2 and y3.

Figure 23:
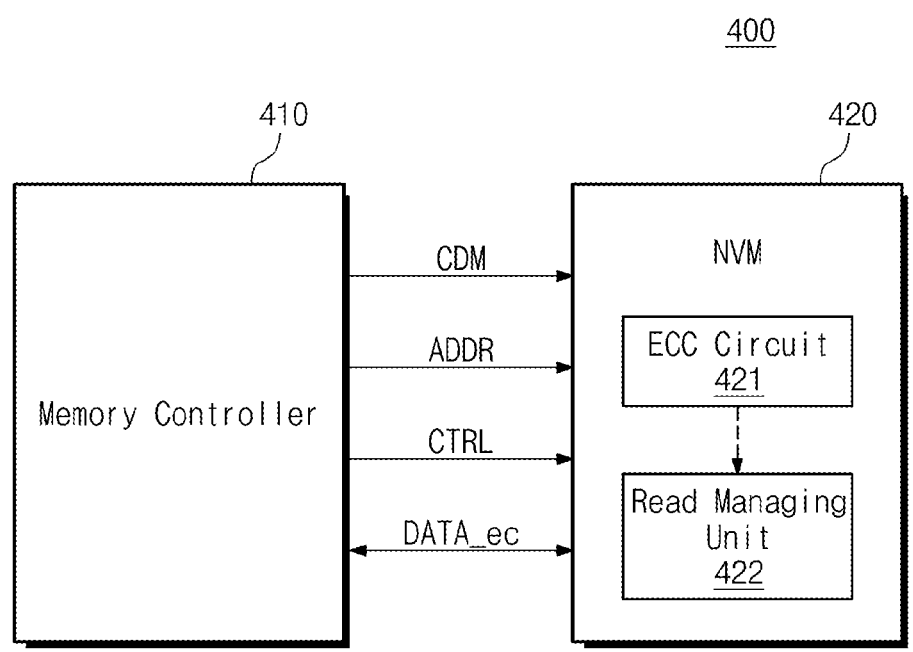
FIG. 23 is a block diagram illustrating a nonvolatile memory system in accordance with example embodiments of inventive concepts.

FIG. 23 is a block diagram illustrating a nonvolatile memory system in accordance with example embodiments of inventive concepts. Referring to FIG. 23, a nonvolatile memory system 400 includes a memory controller 410 and a nonvolatile memory device 420.

The memory controller 410 can transmit a command CMD, an address ADDR and a control signal CTRL to the nonvolatile memory device 420 to control the nonvolatile memory device 420. The memory controller 410 may be included in an external device (for example, host, AP, etc.).

The nonvolatile memory device 420 can write data and/or output data in response to signals received from the memory controller 410. The nonvolatile memory device 420 may include an ECC (error correction code) circuit 421 and a read management unit 422. Since the ECC (error correction code) circuit 421 and the read management unit 422 were described with reference to FIGS. 1 through 19, a detailed description thereof is omitted.

The nonvolatile memory device 420 including the ECC (error correction code) circuit 421 and the read management unit 422 may be embodied by one chip or one package. The operations described with reference to FIGS. 1 through 19 were performed by the memory controller 110 but the nonvolatile memory device 420 illustrated in FIG. 23 can perform the operations described with reference to FIGS. 1 through 19. That is, data DATA_ec being output from the nonvolatile memory device 420 may be an error corrected data DATA_ec.

Figure 24:
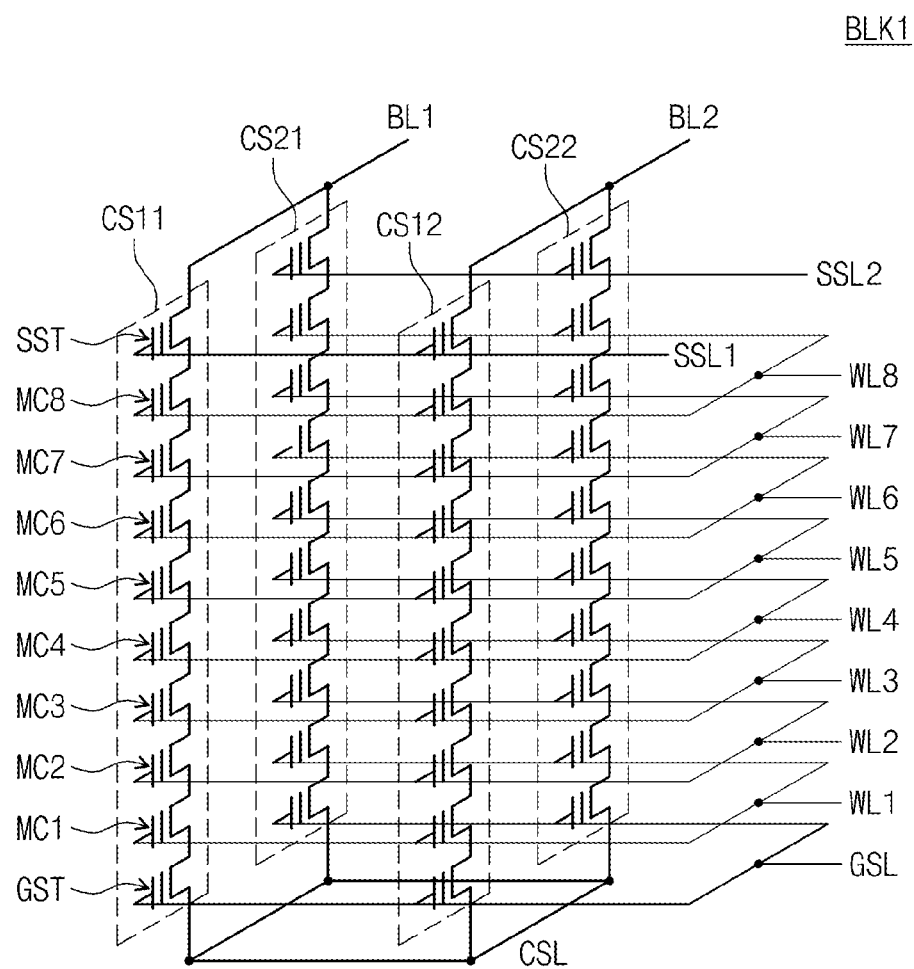
FIG. 24 is a circuit illustrating a first memory block among a plurality of memory blocks included in a nonvolatile memory system in accordance with example embodiments of inventive concepts.

FIG. 24 is a circuit illustrating a first memory block among a plurality of memory blocks included in a nonvolatile memory system in accordance with example embodiments of inventive concepts. The first memory block BLK1 is a memory block having a three-dimensional vertical laminated structure. Although not illustrated in the drawing, the remaining memory blocks except the first memory block BLK1 may also have a similar structure to the first memory block BLK1.

Referring to FIG. 24, the first memory block BLK1 includes a plurality of cell strings CS11, CS12, CS21 and CS22. The cell strings CS11, CS12, CS21 and CS22 are arranged along a row direction and a column direction to form rows and columns.

Each of the cell strings CS11, CS12, CS21 and CS22 may include a plurality of cell transistors. The cell transistors includes a string select transistor SST, a plurality of memory cells MC1~MC8 and a ground select transistor GST. In each of the strings CS11, CS12, CS21 and CS22, the string select transistor SST is connected to a string select line SSL. The string select line SSL may be divided into first and second string select lines SSL1 and SSL2. In each of the strings CS11, CS12, CS21 and CS22, the memory cells MC1~MC8 are connected to word lines WL1~WL8, respectively. Word lines having the same height are connected in common. In each of the strings CS11, CS12, CS21 and CS22, the ground select transistor GST is connected to a ground select line GSL. Each cell string is connected between a bit line BL and a common source line CSL. That is, the string select transistor SST is connected to the bit line BL and the ground select transistor GST is connected to the common source line CSL.

Cell strings disposed in the same column are connected to the same bit line. For example, the cell strings CS11 and CS21 are connected to a first bit line BL1. The cell strings CS12 and CS22 are connected to a second bit line BL2.

Cell strings disposed in the same row are connected to the same string select line. For example, the cell strings CS11 and CS12 are connected to the first string select line SSL1. The cell strings CS21 and CS22 are connected to the second string select line SSL2.

Each of the cell strings CS11, CS12, CS21 and CS22 is stacked in a direction perpendicular to a substrate (not shown). For example, the ground select transistor GST, the memory cells MC1~MC8 and the string select transistor SST may be stacked in the direction perpendicular to the substrate to be formed. In example embodiments, the memory cells MC1~MC8 may be constituted by charge trap flash (CTF) memory cells.

The first memory block BLK1 illustrated in FIG. 24 is illustrative, but, inventive concepts are not limited thereto. For example, the number of rows of cell strings may be increased or reduced. As the number of rows of cell strings is changed, the number of string select lines or ground select lines connected to rows of the cell strings and the number of cell strings connected to one bit line may also be changed.

The number of columns of cell strings may be increased or reduced. As the number of columns of cell strings is changed, the number of bit lines connected to columns of the cell strings and the number of cell strings connected to one string select line may also be changed.

A height of cell strings may be increased or reduced. For example, the number of memory cells being stacked in each cell string may be increased or reduced. As the number of memory cells being stacked in each cell string is changed, the number of word lines may also be changed.

The number of string select transistors or ground select transistors being provided each cell string may be increased. For example, as the number of string select transistors or ground select transistors being provided each cell string is changed, the number of string select lines or ground select lines may also be changed. In the case that the number of string select lines or ground select lines is increased, the string select lines or the ground select lines may be stacked in the same form as the memory cells MC1~MC8.

In example embodiments, write and read operations may be performed by a row unit of the cell strings CS11, CS12, CS21 and CS22. The cell strings CS11, CS12, CS21 and CS22 may be selected by one row unit by the string select lines SSL1 and SSL2.

In a selected row of the cell strings CS11, CS12, CS21 and CS22, write and read operations may be performed by a page unit. The page may be one row of memory cells connected to one word line. Alternatively, the page may be a unit of data stored in one row of memory cells connected to one word line. In a selected row of the cell strings CS11, CS12, CS21 and CS22, memory cells may be selected by a page unit by the word lines WL1~WL8.

Figure 25:
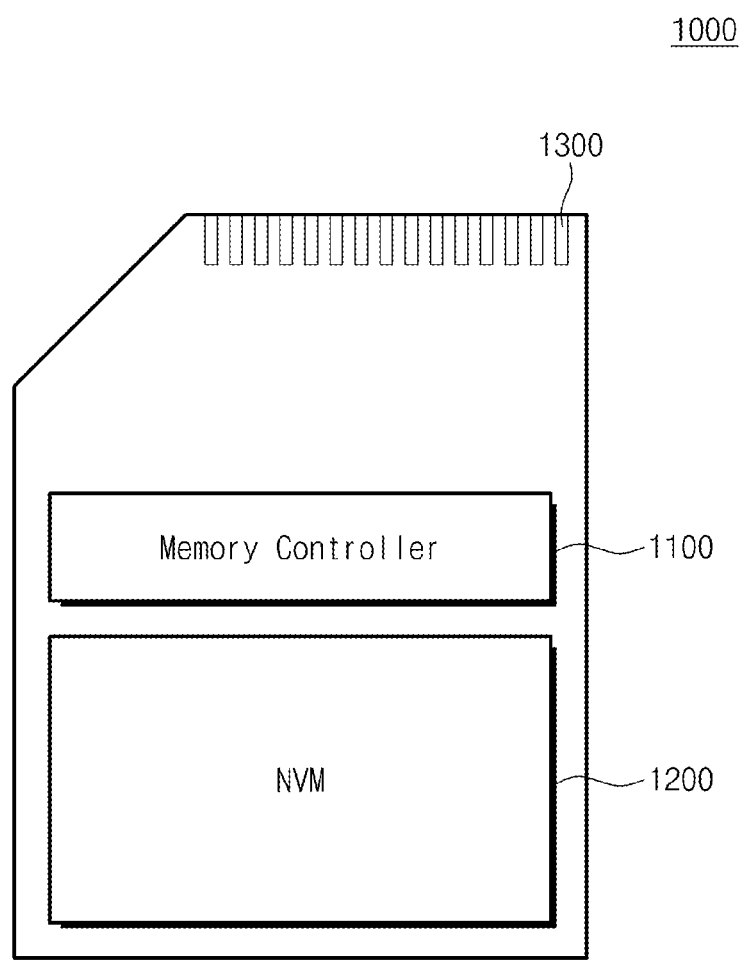
FIG. 25 is a block diagram illustrating a memory card system including a nonvolatile memory system in accordance with inventive concepts.

FIG. 25 is a block diagram illustrating a memory card system including a nonvolatile memory system in accordance with inventive concepts. Referring to FIG. 25, the memory card system 1000 includes a controller 1100, a nonvolatile memory 1200, and a connector 1300.

The controller 1100 is connected to the nonvolatile memory 1200. The controller 1100 is configured to access the nonvolatile memory 1200. For example, the controller 1100 is configured to control read, write, erase and background operations of the nonvolatile memory 1200. The controller 1100 is configured to provide an interface between the nonvolatile memory 1200 and a host. The controller 1100 may be configured to drive firmware for controlling the nonvolatile memory 1200.

The controller 1100 may include constituent elements such as a RAM (random access memory), a processing unit, a host interface, a memory interface and an error correction unit.

The controller 1100 can communicate with an external device through the connector 1300. The controller 1100 can communicate with an external device (for example, a host) according to a specific communication standard. The controller 1100 may be configured to communicate with an external device through at least one of various communication standards such as a universal serial bus (USB), a multimedia card (MMC), an embedded-MMC, a peripheral component interconnection (PCI), a PCI-express, an advanced technology attachment (ATA), a serial-ATA, a parallel-ATA, a small computer small interface (SCSI), an enhanced small disk interface (ESDI), an integrated drive electronics (IDE), a mobile industry processor interface (MIPI), a nonvolatile memory-express (NVM-e), a universal flash storage (UFS), etc.

The controller 1100 can perform the operations described with reference to FIGS. 1 through 19.

The nonvolatile memory 1200 can be embodied by various nonvolatile memory devices such as an EPROM (electrically erasable and programmable ROM), a NAND flash memory, a NOR flash memory, a PRAM (phase change RAM), an ReRAM (resistive RAM), a FRAM (ferroelectric RAM), a STT-MRAM (spin torque magnetic RAM), etc.

The nonvolatile memory 1200 may be one of the nonvolatile memory devices 120, 220, 320 and 420 described with reference to FIGS. 1 through 23. The nonvolatile memory 1200 can perform the operations described with reference to FIGS. 1 through 19.

The controller 1100 and the nonvolatile memory 1200 can be integrated in one semiconductor device. As an illustration, the controller 1100 and the nonvolatile memory 1200 can be integrated in one semiconductor device to form a SSD (solid state drive). The controller 1100 and the nonvolatile memory 1200 can be integrated in one semiconductor device to constitute a memory card. The controller 1100 and the nonvolatile memory 1200 can be integrated in one semiconductor device to constitute a memory card such as a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

The nonvolatile memory 1200 and the memory card system 1000 can be mounted in various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi-chip package (MCP), wafer-level fabricated package (WFP) and wafer-level processed stack package (WSP).

Figure 26:
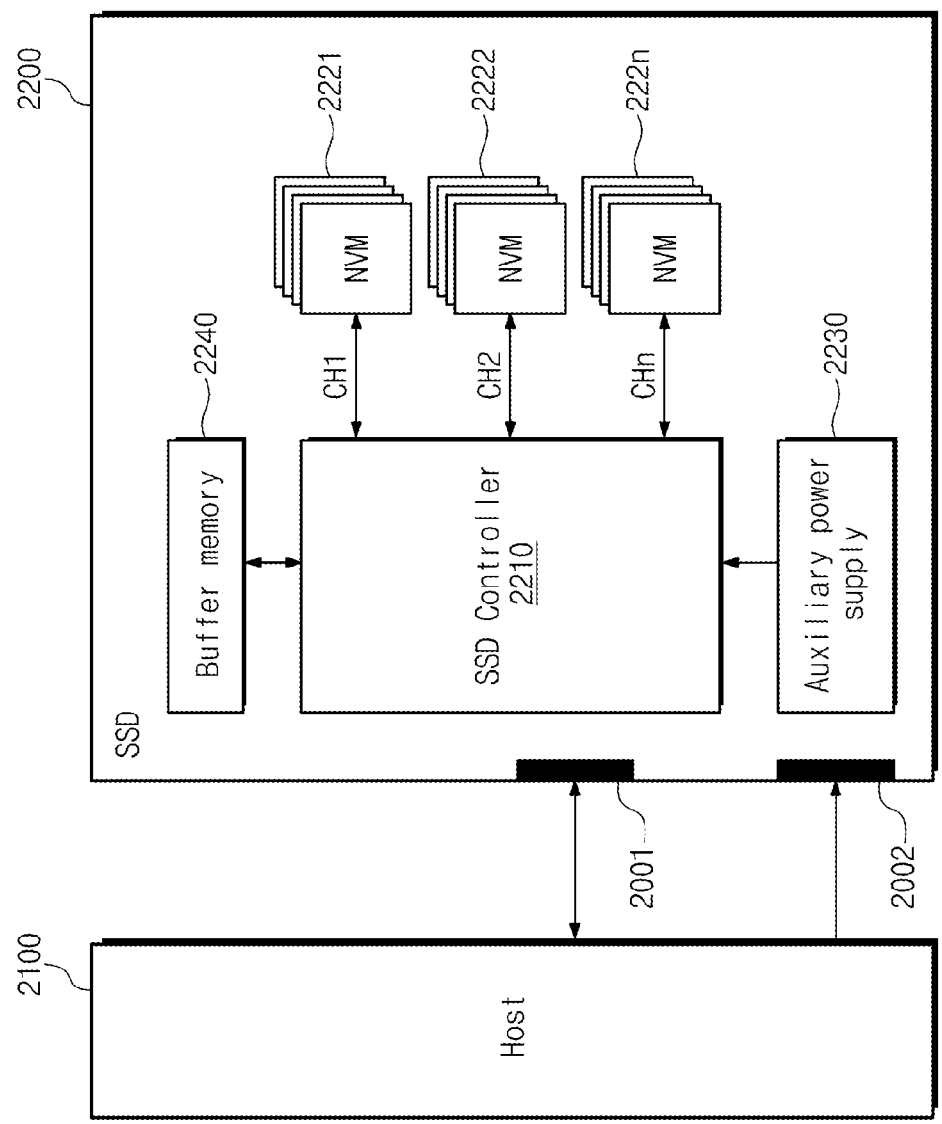
FIG. 26 is a block diagram illustrating a SSD (solid state drive) system including a nonvolatile memory system in accordance with inventive concepts.

FIG. 26 is a block diagram illustrating a SSD (solid state drive) system including a nonvolatile memory system in accordance with inventive concepts. Referring to FIG. 26, the SSD system 2000 includes a host 2100 and a SSD 2200. The SSD 2200 exchanges a signal SGL with the host 2100 through a signal connector 2001 and is inputted with power through a power connector 2002. The SSD 2200 includes a plurality of flash memories 2221~222n, a SSD controller 2210, an auxiliary power supply 2230 and a buffer memory 2240.

The SSD controller 2210 can control the flash memories 2221~222n in response to the signal SIG received from the host 2100. The SSD controller 2210 may be a memory controller according to example embodiments described above with reference to FIGS. 1-23.

The auxiliary power supply 2230 is connected to the host 2100 through the power connector 2002. The auxiliary power supply 2230 is inputted with power from the host 2100 to be charged. In the case that power from the host 2100 is not smoothly supplied, the auxiliary power supply 2230 may provide power of the SSD system 2000. The auxiliary power supply 2230 may be located inside the SSD 2200 or outside the SSD 2200. For example, the auxiliary power supply 2230 can be located on a main board to provide auxiliary power to the SSD 2200.

The buffer memory 2240 operates as a buffer memory. For example, the buffer memory 2240 can temporarily store data received from the host 2100, data received from the flash memories 2221~222n, or meta data (for example, mapping table) of the flash memories 2221~222n. The buffer memory 2240 may include a volatile memory such as DRAM, SDRAM, DDR SDRAM, LPDDR SDRAM, SRAM, etc. or a nonvolatile memory such as FRAM, ReRAM, STT-MRAM, PRAM, etc.

The SSD controller 2210 can perform the operations described with reference to FIGS. 1 through 19. Each of the flash memories 2221~222n may be one of the nonvolatile memory devices 120, 220, 320 and 420 described with reference to FIGS. 1 through 23 and can perform the operations described with reference to FIGS. 1 through 19.

Figure 27:
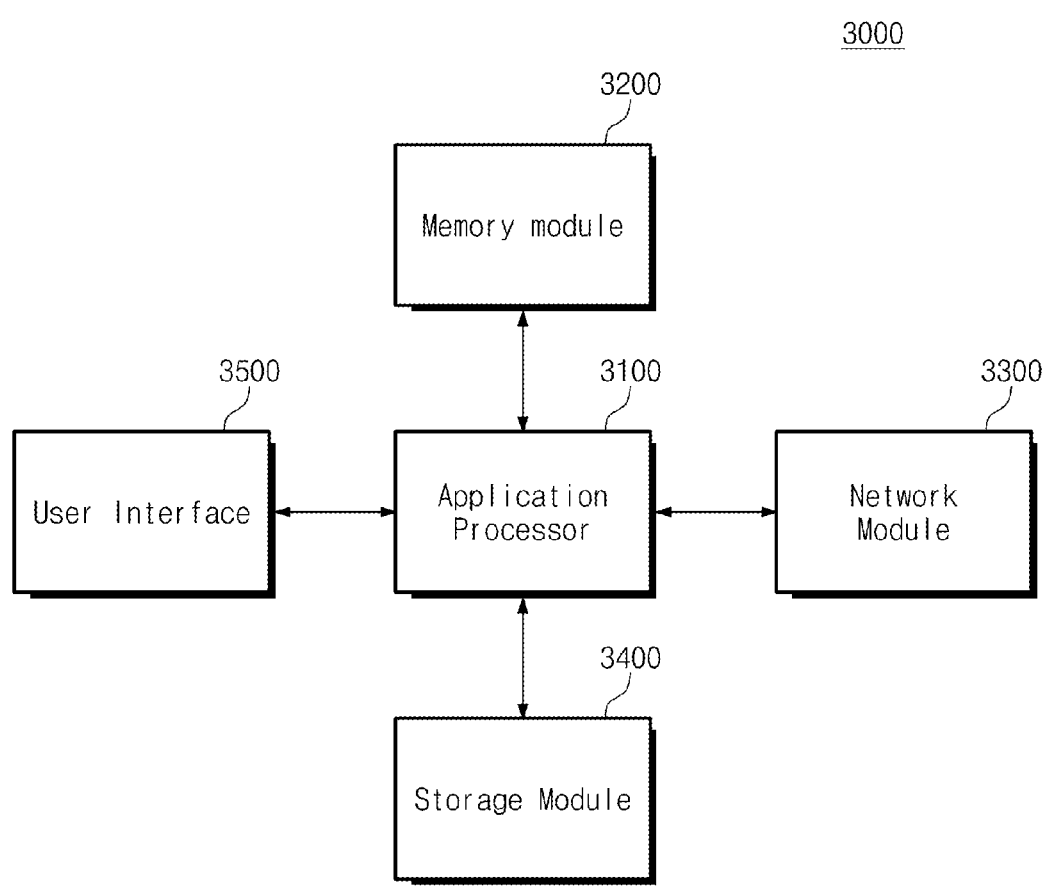
FIG. 27 is a block diagram illustrating a user system including a nonvolatile memory system in accordance with inventive concepts.

FIG. 27 is a block diagram illustrating a user system including a nonvolatile memory system in accordance with inventive concepts. Referring to FIG. 27, a user system 3000 includes an application processor 3100, a memory module 3200, a network module 3300, a storage module 3400 and a user interface 3500.

The application processor 3100 can drive constituent elements included in the user system 3000 and an OS (operating system) that are included in the user system 3000. The application processor 3100 may include controllers controlling constituent elements included in the user system 3000, a graphic engine, and various interfaces. The application processor 3100 may be provided by a system-on-chip SoC.

The memory module 3200 can operate as a main memory, an operation memory, a buffer memory or a cache memory. The memory module 3200 may include a volatile random access memory such as DRAM, SDRAM, DDR SDRAM, DDR2 SDRAM, DDR3 SDRAM, LPDDR DRAM, LPDDR2 DRAM, LPDDR3 DRAM, etc. or a nonvolatile random access memory such as PRAM, ReRAM, MRAM, FRAM, etc. The memory module 3200 can be packaged using a POP method with the application processor 3100.

The network module 3300 can perform a communication with external devices. The network module 3300 can support a wireless communication such as a CDMA (code division multiple access), a GSM (global system for mobile communication), a WCDMA (wideband CDMA), a CDMA-2000, a TDMA (time division multiple access), a LTE (long term evolution), a Wimax, a WLAN, a UWB, a blue tooth, a WI-DI, etc. The network module 3300 may be included in the application processor.

The storage module 3400 can store data. For example, the storage module 3400 can store data received from the application processor 3100. The storage module 3400 can transmit data stored in the storage module 3400 to the application processor 3100. The storage module 3400 can be embodied by a nonvolatile semiconductor memory device such as a PRAM, a MRAM, a RRAM, a NAND flash, a NOR flash, a three-dimensional NAND flash, etc.

The storage module 3400 may be one of the nonvolatile memory systems described with reference to FIGS. 1 through 23. The storage module 3400 can perform the operation described with reference to FIGS. 1 through 19. The storage module 3400 may be the nonvolatile memory device 220 described with reference to FIGS. 21 through 23. In this case, the application processor 3100 includes a memory controller and the storage module 3400 can output data of which an error is corrected under the control of the application processor 3100.

The user interface 3500 may include interfaces that input data or a command into the application processor 3100 or output data to an external device. The user interface 3500 may include user input interfaces such as a keyboard, a keypad, a button, a touch panel, a touch screen, a touch pad, a touch ball, a camera, a mike, a gyroscope sensor, a vibration sensor, a piezoelectric element, etc. The user interface 3500 may include user output interfaces such as a liquid crystal display (LCD), an organic light emitting diode (OLED) display, an active matrix OLED (AMOLED) display, a LED, a speaker, a motor, etc.

According to example embodiments of inventive concepts, in the case that data read from a nonvolatile memory device includes an error, a nonvolatile memory system can detect optimum read voltages on the basis of a sampling operation. For example, in the case of detecting an optimum read voltage for distinguishing a specific program state, the nonvolatile memory system detects the number of on-cells on the basis of one sampling voltage among a plurality of sampling voltages corresponding to a specific program state and compares the detected number of on-cells with a reference value corresponding to the specific program state to set a sampling direction. Thus, a nonvolatile memory system having improved reliability is provided.

According to example embodiments of inventive concepts, a nonvolatile memory system compares the number of on-cells with a reference value to set a sampling direction. The nonvolatile memory system can perform a sampling operation along the set sampling direction to detect an optimum read voltage. Thus, a nonvolatile memory system having improved reliability is provided.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An operation method of a nonvolatile memory system including a memory controller configured to control a nonvolatile memory,
    wherein the nonvolatile memory device comprises a three-dimensional memory cell array including a plurality of memory blocks each comprising a plurality of cell strings, each of cell strings comprises a plurality of memory cells stacked in a direction perpendicular to a substrate, a ground selection transistor disposed between the memory cells and the substrate, and a string selection transistor disposed between the memory cells and a bitline,
    the operation method comprises:
    performing a cell-counting operation on selected memory cells of the plurality of memory cells to detect a cell count;
    comparing the detected cell count with a reference value;
    setting a plurality of sampling voltages based on a result of the comparison;
    performing a sampling operation with respect to the selected memory cells using the plurality of sampling voltages; and
    performing a read operation on the selected memory cells based on a result of the sampling operation.

2. The operation method of claim 1, wherein the cell-counting operation includes:
    reading data from the selected memory cells;
    detecting and correcting an error of the read data; and
    detecting the cell count of the selected memory cells using a sampling start voltage of the plurality of sampling voltages if the error of the read data is not corrected.

3. The operation method of claim 1, wherein the setting a plurality of sampling voltages based on a result of the comparison includes:
    setting the plurality of sampling voltages lower than a sampling start voltage if the detected cell count is greater than the reference value, or
    setting the plurality of sampling voltages higher than the sampling start voltage if the detected cell count is not greater than the reference value.

4. The operation method of claim 3, wherein the performing the sampling operation includes:
    generating a plurality of sample data by performing the sampling operation on the selected memory cells using the plurality of sampling voltages; and
    detecting first through third values using the generated sample data.

5. The operation method of claim 4, wherein the performing the sampling operation further includes:
    comparing the first through third values; and
    performing an additional sampling operation on the selected memory cells or detecting an optimum read voltage for distinguishing any one program state among a plurality of program states of the plurality of memory cells based on the result of the sampling operation.

6. The operation method of claim 5, wherein the sampling voltages include the sampling start voltage and first through third sampling voltages,
    wherein the detecting the first through third values includes detecting the first value using the lowest two sampling voltages among the sampling start voltage and the first through third sampling voltages and detecting the third value using the highest two sampling voltages among the sampling start voltage and the first through third sampling voltages, and
    wherein the performing the additional sampling operation on the memory cells or the detecting the optimum read voltage includes the detecting the optimum read voltage if the second value is smaller than the first and third values, and the performing the additional sampling operation if the second value is not smaller than the first and third values.

7. The operation method of claim 6, wherein the detecting optimum read voltage is performed using a regression analysis.

8. The operation method of claim 5, wherein the performing a read operation on the selected memory cells comprises reading data stored in the selected memory cells using the optimum read voltage.

9. The operation method of claim 1, wherein
    the memory cells have a plurality of program states, and
    the reference value has a different value depending on each of the program states of the selected memory cells.

10. The operation method of claim 1, wherein
    the memory cells have a plurality of program states, and
    the reference value corresponds to a number of memory cells turned-on by an optimum read voltage with respect to each of the program states.

11. The operation method of claim 2, wherein the data stored in the selected memory cells is randomized data.

12. An operation method of a storage device,
    wherein the storage device includes a three-dimensional memory cell array including a plurality of memory blocks each comprising a plurality of cell strings, each of cell strings comprises a plurality of memory cells stacked in a direction perpendicular to a substrate, a ground selection transistor disposed between the memory cells and the substrate, and a string selection transistor disposed between the memory cells and a bitline, the operation method comprises:

detecting first through third values by sampling selected memory cells of the plurality of memory cells using first through fourth sampling voltages;

comparing the first through third values;

comparing a cell count corresponding to any one sampling voltage among the first through fourth sampling voltages with a reference value, based on a result of the comparing the first through third values;

performing an additional sampling operation on the selected memory cells based on a result of the comparing the cell count and the reference value; and performing a read operation on the memory cells based on a result of the additional sampling operation.

13. The operation method of claim 12, wherein the first sampling voltage is smaller than the second sampling voltage, the second sampling voltage is smaller than the third sampling voltage, the third sampling voltage is smaller than the fourth sampling voltage, and the detecting first through third values includes determining the first value based on a number of memory cells having a threshold voltage between the first and second sampling voltages, determining the second value based on a number of memory cells having a threshold voltage between the second and third sampling voltages, determining the third value based on a number of memory cells having a threshold voltage between the third and fourth sampling voltages, among the selected memory cells.

14. The operation method of claim 13, wherein the comparing the first through third values includes determining whether the second value is smaller than the first and third values.

15. The operation method of claim 14, wherein the comparing the cell count with the reference value includes comparing the cell count with the reference value if the second value is not smaller than the first and third values.

16. An operation method of a nonvolatile memory device, wherein the nonvolatile memory device comprises a three-dimensional memory cell array including a plurality of memory blocks each comprising a plurality of cell strings, each of cell strings comprises a plurality of memory cells stacked in a direction perpendicular to a substrate, a ground selection transistor disposed between the memory cells and the substrate, and a string selection transistor disposed between the memory cells and a bitline, the operation method comprises:

performing a cell counting operation on selected memory cells of the plurality of memory cells to detect a cell count;

comparing the detected cell count with a reference value;

performing a sampling operation on the selected memory cells based on a result of comparison;

the sampling operation including setting first to third sampling voltages in one of a first direction and a second direction relative to a previous sampling voltage applied to the selected memory cells based on a result of the comparison, the first direction being different than the second direction, the first to third sampling voltages being different from each other; and performing a read operation on the selected memory cells based on a result of the sampling operation.

17. The operation method of claim 16, wherein the performing a cell counting operation includes reading data from the selected memory cells by applying a sampling start voltage to a selected word line connected to the selected memory cells, and detecting the cell count based on the read data.

18. The operation method of claim 16, wherein the performing the sampling operation in the first direction including setting the first to third sampling voltages lower than the previous sampling voltage, and the performing the sampling operation in the second direction including setting the first to third sampling voltages higher than the previous sampling voltage.

19. The operation method of claim 16, wherein the performing the sampling operation includes detecting first through third values from selected the memory cells using the first through third sampling voltages, the second sampling voltage is in between the first and third sampling voltages, the performing the sampling operation includes determining the first value based on a number of the memory cells in the same page having a threshold voltage between the previous sampling voltage and the first sampling voltage, determining the second value based on a number of the memory cells in the same page having a threshold voltage between the first sampling voltage and the second sampling voltage, and determining the third value based on a number of the memory cells in the same pages having a threshold voltage between the second sampling voltage and the third sampling voltage.

20. The operation method of claim 18 further comprises:

comparing the first to third values; and performing an additional sampling operation if the second value is greater than the first value or the second value is greater than the third value, and reading data from the memory cells in the same page using the optimum read voltage if the second value is less than the first value and the second value is less than the third value.

* * * * *